(12) United States Patent
Cheng et al.

(10) Patent No.: US 9,209,094 B2
(45) Date of Patent: Dec. 8, 2015

(54) FIN FIELD EFFECT TRANSISTOR WITH DIELECTRIC ISOLATION AND ANCHORED STRESSOR ELEMENTS

(71) Applicant: GLOBALFOUNDRIES INC., Grand Cayman (KY)

(72) Inventors: Kangguo Cheng, Schenectady, NY (US); Ramachandra Divakaruni, Ossining, NY (US); Ali Khakifirooz, Mountain View, CA (US); Kern Rim, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/952,993

(22) Filed: Jul. 29, 2013

(65) Prior Publication Data
US 2015/0028419 A1    Jan. 29, 2015

(51) Int. Cl.
*H01L 27/00* (2006.01)
*H01L 21/00* (2006.01)
*H01L 21/84* (2006.01)
*H01L 29/78* (2006.01)
*H01L 27/12* (2006.01)

(52) U.S. Cl.
CPC .......... *H01L 21/845* (2013.01); *H01L 27/1211* (2013.01); *H01L 29/7848* (2013.01)

(58) Field of Classification Search
CPC .............. H01L 29/785; H01L 29/7855; H01L 29/66795; H01L 29/41766; H01L 29/41783; H01L 29/66636; H01L 21/823418; H01L 21/823425

USPC ......................................................... 257/347
See application file for complete search history.

(56) References Cited

U.S. PATENT DOCUMENTS

| | | | |
|---|---|---|---|
| 7,566,482 B2 * | 7/2009 | Choe et al. ................... | 427/526 |
| 7,781,800 B2 * | 8/2010 | Chen et al. ................... | 257/190 |
| 7,939,862 B2 * | 5/2011 | Moroz et al. ................. | 257/255 |
| 7,947,543 B2 | 5/2011 | Kim | |
| 8,273,617 B2 | 9/2012 | Thompson et al. | |
| 2005/0017377 A1 | 1/2005 | Joshi et al. | |
| 2013/0020638 A1 | 1/2013 | Thompson et al. | |
| 2015/0041897 A1 * | 2/2015 | Basker et al. ................. | 257/347 |

* cited by examiner

*Primary Examiner* — Colleen A Matthews
*Assistant Examiner* — Quovaunda V Jefferson
(74) *Attorney, Agent, or Firm* — Scully, Scott, Murphy & Presser, P.C.

(57) ABSTRACT

A first fin field effect transistor and a second fin field effect transistor are formed on an insulator layer overlying a semiconductor material layer. A first pair of trenches is formed through the insulator layer in regions in which a source region and a drain region of the first fin field effect transistor is to be formed. A second pair of trenches is formed partly into the insulator layer without extending to the top surface of the semiconductor material layer. The source region and the drain region of the first field effect transistor can be epitaxial stressor material portions that are anchored to, and epitaxially aligned to, the semiconductor material layer and apply stress to the channel of the first field effect transistor to enhance performance. The insulator layer provides electrical isolation from the semiconductor material layer to the second field effect transistor.

20 Claims, 21 Drawing Sheets

FIN FIELD EFFECT TRANSISTOR WITH DIELECTRIC ISOLATION AND ANCHORED STRESSOR ELEMENTS

BACKGROUND

The present disclosure relates to a semiconductor structure, and particularly to fin field effect transistors having dielectric isolation from an underlying semiconductor layer, and methods of manufacturing the same.

A finFET is a field effect transistor including a channel located in a semiconductor fin having a height that is greater than a width. FinFETs employ vertical surfaces of semiconductor fins to effectively increase a device area without increasing the physical layout area of the device. Fin-based devices are compatible with fully depleted mode operation if the lateral width of the fin is thin enough. For these reasons, fin-based devices can be employed in advanced semiconductor chips to provide high performance devices.

A finFET formed on a semiconductor-on-insulator (SOI) substrate provides excellent electrical isolation from an underlying substrate and neighboring semiconductor devices. Stressor elements formed on a finFET on an SOI substrate do not effectively provide stress to the channel of the finFET. For example, a stressed source region or a stressed drain region formed above an insulator layer underlying the semiconductor fin is free to expand laterally, and therefore, the stress generated by the stressor element is mitigated by deformation of the stressor element. Thus, a fin field effect transistor that can effectively transmit the stress generated by a stressor element without loss is desired.

SUMMARY

A first fin field effect transistor and a second fin field effect transistor are formed on an insulator layer overlying a semiconductor material layer. A first pair of trenches is formed through the insulator layer in regions in which a source region and a drain region of the first fin field effect transistor is to be formed. A second pair of trenches is formed partly into the insulator layer without extending to the top surface of the semiconductor material layer. The source region and the drain region of the first field effect transistor can be epitaxial stressor material portions that are anchored to, and epitaxially aligned to, the semiconductor material layer and apply stress to the channel of the first field effect transistor to enhance performance. The insulator layer provides electrical isolation from the semiconductor material layer to the second field effect transistor.

According to an aspect of the present disclosure, a semiconductor structure includes a doped semiconductor layer located in a semiconductor substrate, an insulator layer located on a top surface of the doped semiconductor layer, a first semiconductor fin located on a first portion of a top surface of the insulator layer, a first source region, and a first drain region. The first source region contacts a first end wall of the first semiconductor fin and filling a first trench extending from the first end wall of the first semiconductor fin through the insulator layer and into the doped semiconductor layer. The first drain region contacts a second end wall of the first semiconductor fin and filling a second trench extending from the second end wall of the first semiconductor fin through the insulator layer and into the doped semiconductor layer. The semiconductor structure further includes a second semiconductor fin located on a second portion of the top surface of the insulator layer, a second source region contacting a first end wall of the second semiconductor fin and vertically spaced from the semiconductor substrate by the insulator layer, and a second drain region contacting a second end wall of the second semiconductor fin and vertically spaced from the semiconductor substrate by the insulator layer.

According to another aspect of the present disclosure, a method of forming a semiconductor structure is provided. A first semiconductor fin and a second semiconductor fin are formed on a top surface of a stack, from bottom to top, of a semiconductor substrate and an insulator layer. A first gate stack and a second gate stack are formed over the first semiconductor fin and the second semiconductor fin, respectively. A first trench and a second trench are formed through the insulator layer and into an upper portion of the semiconductor substrate by etching. Unmasked portions of the first semiconductor fin and the insulator layer can be etched employing a combination of at least a patterned mask layer and the first gate stack as an etch mask. The first trench is formed on one side of the first gate stack and the second trench is formed on another side of the gate stack. A first source region is formed in the first trench, on a first end wall of a remaining portion of the first semiconductor fin, and on a first portion of the semiconductor substrate. A first drain region is formed in the second trench, on a second end wall of the remaining portion of the semiconductor fin, and on a second portion of the semiconductor substrate. A second source region and a second drain region are formed on a remaining portion of the second semiconductor fin. The second source region and the second drain region are vertically spaced from the semiconductor substrate by the insulator layer.

DETAILED DESCRIPTION

Figure 1:
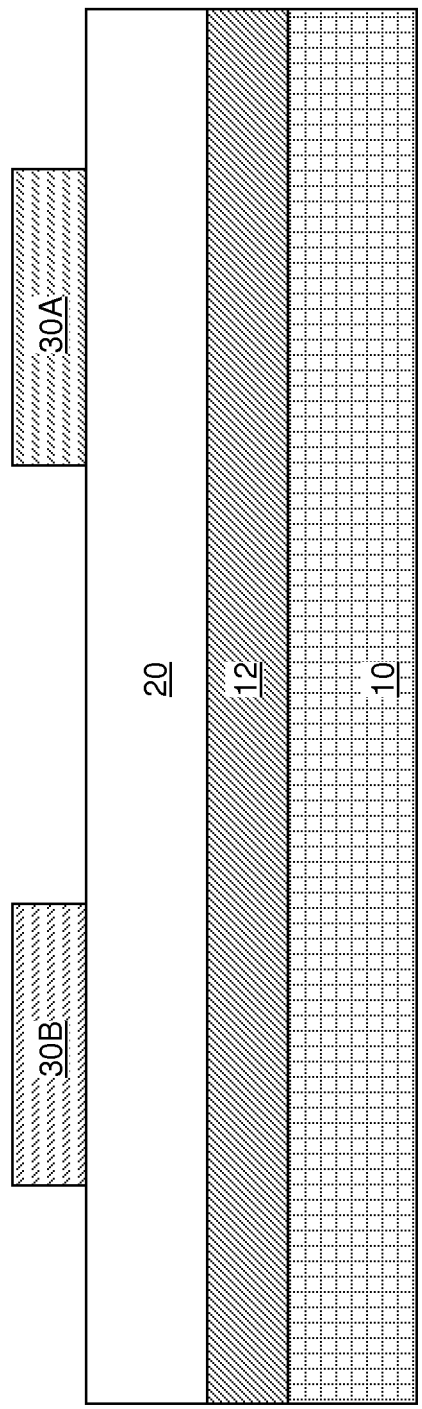
FIG. 1 is a vertical cross-sectional view of a first exemplary semiconductor structure after formation of a doped semiconductor material layer in a semiconductor substrate and formation of semiconductor fins over an insulator layer according to a first embodiment of the present disclosure.

As stated above, the present disclosure relates to fin field effect transistors having dielectric isolation from an underlying semiconductor layer, and methods of manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

Referring to FIG. 1, a first exemplary semiconductor structure according to a first embodiment of the present disclosure includes a semiconductor substrate (10, 12), an insulator layer 20 located on a surface of the semiconductor substrate (10,12), and semiconductor fins (30A, 30B) formed on a top surface of the insulator layer 20. As used herein, a "semiconductor fin" refers to a semiconductor material portion having a pair of parallel vertical sidewalls. As used herein, a "lengthwise direction" of a semiconductor fin refers to a horizontal direction along which a pair of parallel vertical sidewalls extends. The semiconductor substrate (10, 12) includes a semiconductor material, which can be an elemental semiconductor material, a III-V compound semiconductor material, a II-VI compound semiconductor material, or a combination thereof.

In one embodiment, the semiconductor substrate (10, 12) can include a doped semiconductor material layer 12 and an underlying semiconductor material layer 10. The doped semiconductor material layer 12 can have a p-type doping or an n-type doping, and the underlying semiconductor material layer 10 can be intrinsic or can have a doping that is the opposite of the conductivity type of the doping of the doped semiconductor material layer 12. If a p-n junction is formed between the doped semiconductor material layer 12 and the underlying semiconductor material layer 10, the p-n junction can provide electrical isolation between the doped semiconductor material layer 12 and the underlying semiconductor material layer 10. In one embodiment, the doped semiconductor material layer 12 can be formed by implanting dopants into an upper portion of a handle substrate including a semiconductor material in a semiconductor-on-insulator (SOI) substrate.

The conductivity type of the doped semiconductor layer 12 is herein referred to as a first conductivity type, which can be p-type or n-type. In one embodiment, the doped semiconductor material layer 12 can be a single crystalline semiconductor material layer. In one embodiment, the doped semiconductor material layer 12 can be a doped single crystalline silicon layer. The thickness of the doped semiconductor material layer 12 can be in a range from 30 nm to 300 nm, although lesser and greater thicknesses can also be employed. The dopant concentration of the doped semiconductor material layer 12 can be in a range from $1.0 \times 10^{16}/cm^3$ to $1.0 \times 10^{19}/cm^3$, although lesser and greater thicknesses can also be employed.

The insulator layer 20 includes a dielectric material such as silicon oxide. The insulator layer 20 can be derived from a buried insulator layer of an SOI substrate. The thickness of the insulator layer 20 can be in a range from 10 nm to 100 nm, although lesser and greater thicknesses can also be employed.

The semiconductor fins (30A, 30B) can include a first semiconductor fin 30A and a second semiconductor fin 30B. The first semiconductor fin 30A and the second semiconductor fin 30B can be independently intrinsic, p-doped, or n-doped. Each of the first semiconductor fin 30A and the second semiconductor fin 30B can be formed on a top surface of a stack, from bottom to top, of the semiconductor substrate (10, 12) and the insulator layer 20.

The semiconductor fins (30A, 30B) can include a single crystalline semiconductor material. In one embodiment, the single crystalline semiconductor material of the semiconductor fins (30A, 30B) can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor fins (30A, 30B) can be formed, for example, by patterning a top semiconductor layer of an SOI substrate by combination of lithographic methods and an anisotropic etch. The height of the semiconductor fins (30A, 30B) can be in a range from 30 nm to 600 nm, although lesser and greater heights can also be employed.

In one embodiment, the first semiconductor fin 30A can be intrinsic, or can be doped with electrical dopants of the first conductivity type. The second semiconductor fin 30B can be intrinsic, or can be doped with dopants of a second conductivity type, which is the opposite of the first conductivity type.

Figure 2A:
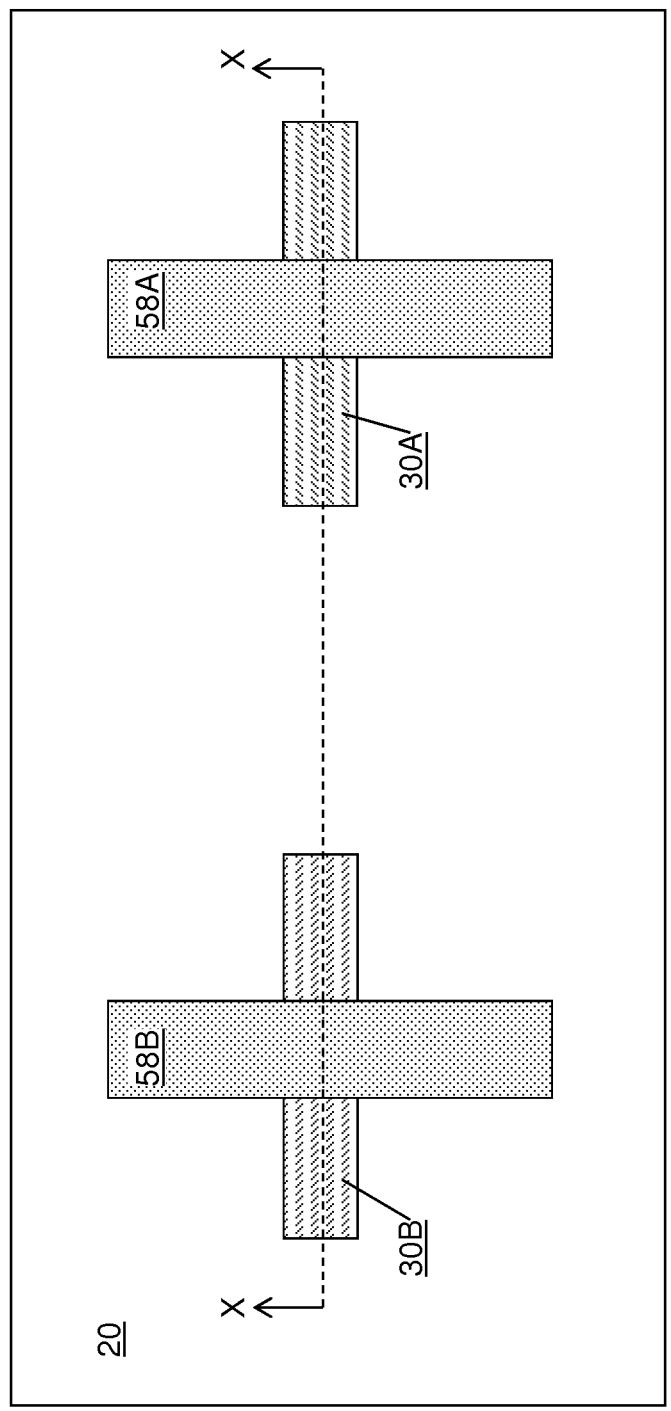
FIG. 2A is a top down view of the first exemplary semiconductor structure after formation of gate stack structures and FIG. 2B is a cross sectional view of FIG. 2A through vertical plane X-X and after forming a first conformal dielectric material layer according to the first embodiment of the present disclosure.

Referring to FIG. 2A, gate stack structures can be formed over the semiconductor fins (30A, 30B). The gate stack structures can be formed, for example, by depositing a gate dielectric layer, a gate conductor layer, and a gate cap dielectric layer. Subsequently, a mask layer (not shown) is applied and lithographically patterned. The pattern in the mask layer is transferred into the gate cap dielectric layer, the gate conductor layer, and the gate dielectric layer by at least one etch, which can include an anisotropic etch. The remaining portions of the gate cap dielectric layer, the gate conductor layer, and the gate dielectric layer constitute the gate stack structures. Each remaining portion of the gate cap dielectric layer can be a gate cap dielectric, each remaining portion of the gate conductor layer can be a gate electrode, and each remaining portion of the gate dielectric layer can be a gate dielectric.

In one embodiment, the gate stack structures can include a first gate stack structure straddling the first semiconductor fin 30A and a second gate stack straddling the second semiconductor fin 30B. The first gate stack structure can include a vertical stack, from bottom to top, of a first gate dielectric 50A, a first gate electrode 52A, and a first gate cap dielectric 58A. The second gate stack structure can include a vertical stack, from bottom to top, of a second gate dielectric 50B, a second gate electrode 52B, and a second gate cap dielectric 58B. See, for example, FIGS. 2A and 2B.

Figure 2B:
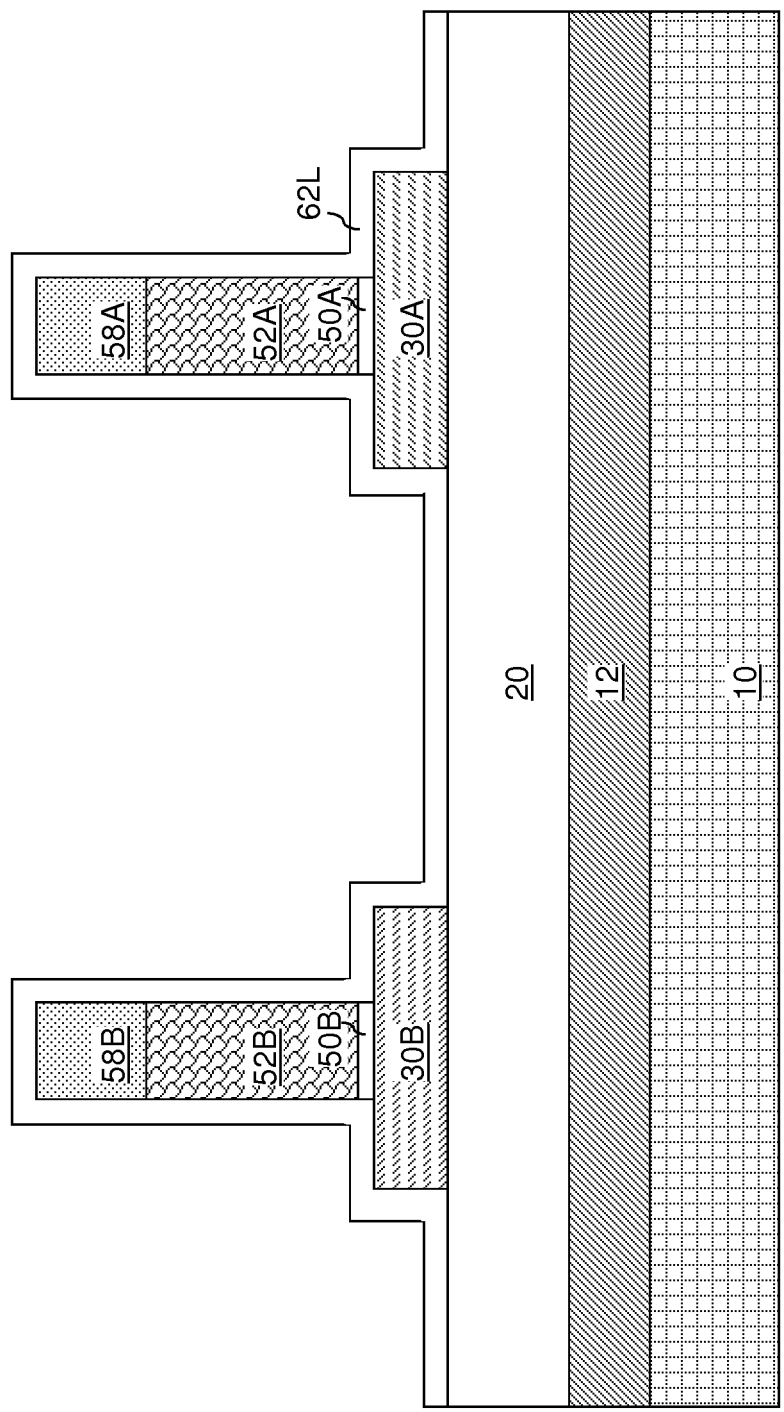

A first conformal dielectric material layer 62L as shown in FIG. 2B can be deposited on the physically exposed surfaces of the first gate stack (50A, 52A, 58A), the second gate stack (50B, 52B, 58B), the first semiconductor fin 30A, the second semiconductor fin 30B, and the insulator layer 20. The first conformal dielectric material layer 62L includes a dielectric material such as silicon nitride, silicon oxide, silicon oxynitride, non-porous organosilicate glass, and/or porous organosilicate glass. The thickness of the first conformal dielectric material layer 62L can be in a range from 10 nm to 100 nm, although lesser and greater thicknesses can also be employed.

Figure 3:
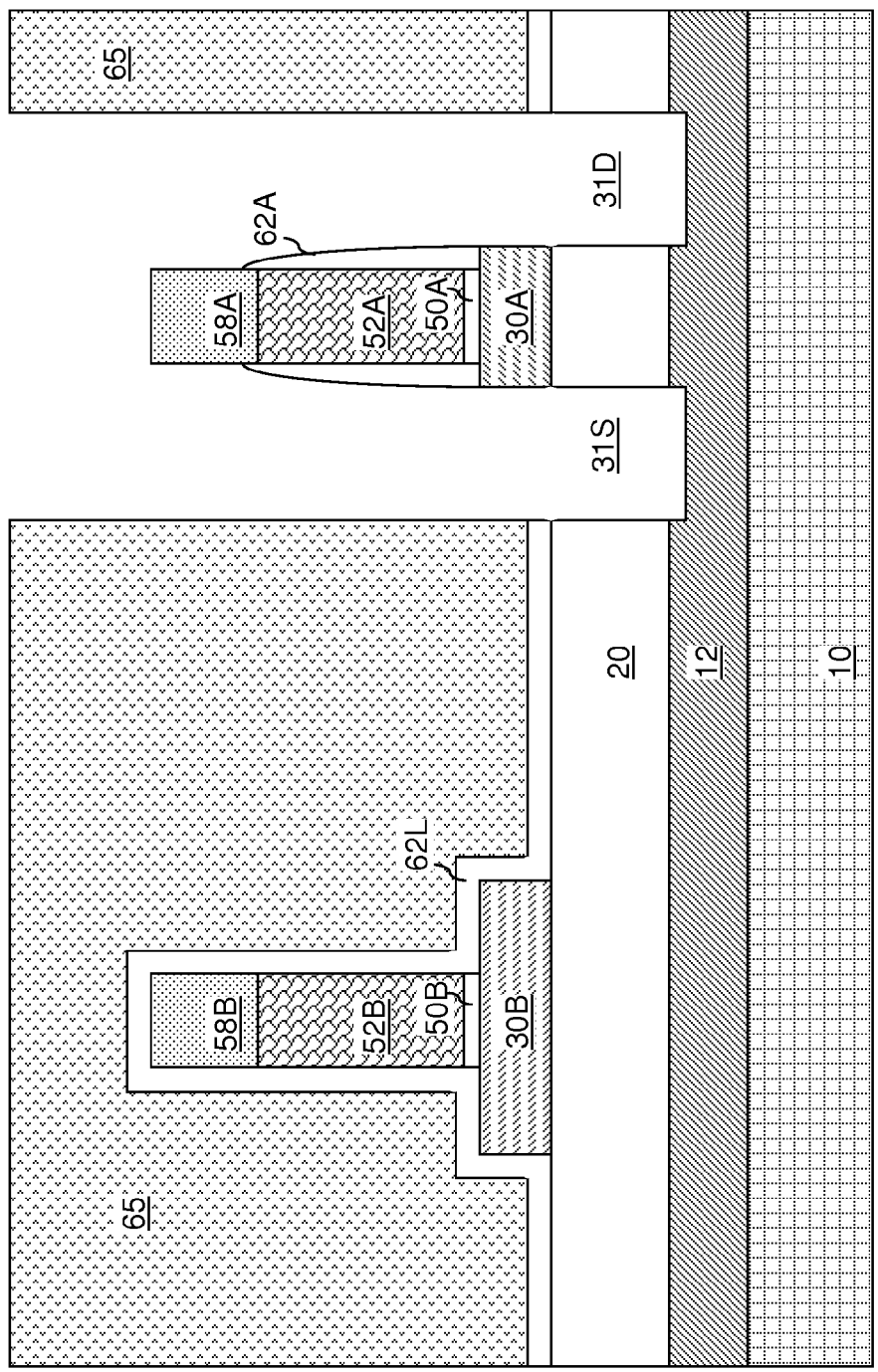
FIG. 3 is a vertical cross-section view of the first exemplary semiconductor structure after formation of a first source-side trench and a drain-side trench and a gate spacer according to the first embodiment of the present disclosure.

Referring to FIG. 3, a first mask layer 65 is formed and patterned. In one embodiment, the first mask layer 65 can be a patterned photoresist layer. For example, a photoresist layer can be applied over the first conformal dielectric material layer 62L and lithographically patterned to form at least one opening over areas in which a source region and a drain region for a field effect transistor to be formed employing the first semiconductor fin 30A. Peripheries of the at least one opening include edges that coincide with boundaries of a source region and a drain region to be formed.

An anisotropic etch is performed on the portion of the first conformal dielectric material layer 62L within the at least one opening. The portions of the first conformal dielectric material layer on the first semiconductor fin 30A and the first gate stack (50A, 52A, 58A) are etched by the anisotropic etch. Horizontal portions of the first conformal dielectric material layer 62L are removed by the anisotropic etch, and remaining vertical portions of the first conformal dielectric material layer 62L within the at least one opening constitute a first gate spacer 62A. The first gate spacer 62A laterally surrounds the first gate stack (50A, 52A, 58A).

Unmasked portions of the first semiconductor fin 30A and the insulator layer 30 can be etched employing the combination of at least the patterned mask layer and the first gate stack (50A, 52A, 58A) as an etch mask. A first trench can be formed on one side of the first gate stack (50A, 52A, 58A), and a second trench can be formed on another side of the gate stack (50A, 52A, 58A).

Specifically, an anisotropic etch process can be performed to remove physically exposed portions of the first semiconductor fin 30A, i.e., the portions of the first semiconductor fin 30A that are not covered by the first gate stack (50A, 52A, 58A) or the first gate spacer 62A. The anisotropic etch that removes the remove physically exposed portions of the first semiconductor fin 30A may, or may not, be selective to the dielectric material of the insulator layer 20.

Subsequently, physically exposed portions of the insulator layer 20 can be etched by another anisotropic etch process. The anisotropic etch process can etch the dielectric material of the insulator layer 20 employing the combination of the patterned first mask layer 65, the first gate stack (50A, 52A, 58A), and the and the first gate stack (50A, 52A, 58A) as an etch mask.

The first trench and the second trench can be formed through the insulator layer 20 by the anisotropic etch. The first trench can be formed within an area in which a source region is to be subsequently formed, and the second trench can be formed within an area in which a drain region is to be subsequently formed. The first trench is herein referred to as a first source-side trench 31S, and the second trench is herein referred to as a first drain-side trench 31D. The first source-side trench 31S and the first drain-side trench 31D can extend into an upper portion of the semiconductor substrate (10, 12). For example, the first source-side trench 31S and the first drain-side trench 31D can extend into the doped semiconductor layer 12 such that the bottom surfaces of the first source-side trench 31S and the first drain-side trench 31D are between the top surface of the doped semiconductor layer 12 and the bottom surface of the doped semiconductor layer 12. In this case, the first source-side trench 31S and the first drain-side trench 31D are formed into the doped semiconductor material layer 12.

End walls of remaining portions of the first semiconductor fin 30A can be vertically coincident with lower portions of sidewalls of the first gate spacer 62A. As used herein, an "end wall" of a semiconductor fin refers to a sidewall surface of the semiconductor fin that is not along the lengthwise direction of the semiconductor fin. As used herein, a first surface is "vertically coincident with" a second surface if there exists a vertical plane that includes the first surface and the second surface. Further, a sidewall surface of the first source-side trench 31S can be vertically coincident with a first end wall of the first semiconductor fin 30A, and a sidewall surface of the first drain-side trench 31D can be vertically coincident with a second end wall of the first semiconductor fin 30A.

The first mask layer 65 is subsequently removed. If the first mask layer 65 is a patterned photoresist layer, the first mask layer 65 can be removed by ashing.

Figure 4:
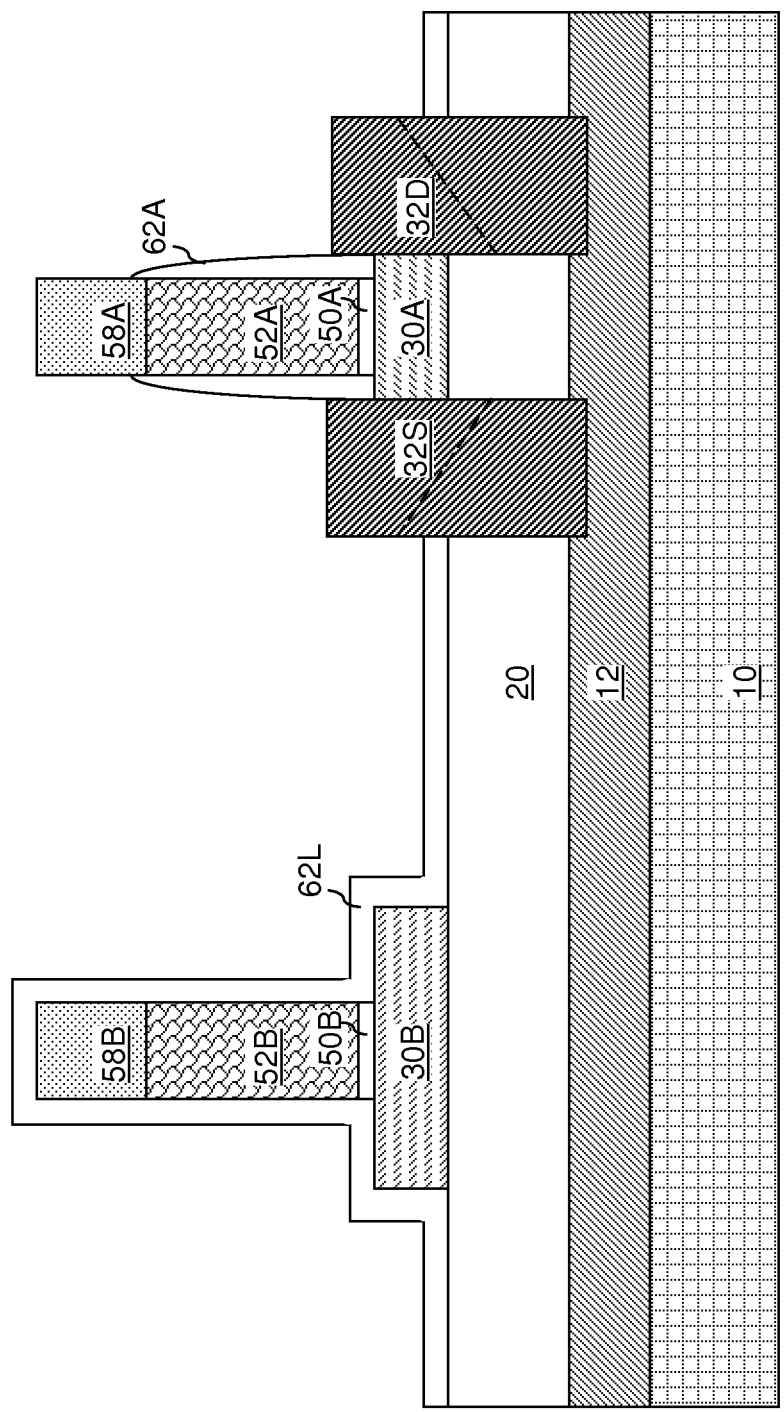
FIG. 4 is a vertical cross-sectional view of the first exemplary semiconductor structure after formation of a first source region and a first drain region by selective deposition of a semiconductor material according to the first embodiment of the present disclosure.

Referring to FIG. 4, a semiconductor material can be deposited on each physically exposed surfaces of the doped semiconductor layer 12 and each physically exposed end surface of the first semiconductor fin 30A. A first source region 32S and a first drain region 32D can be formed, for example, by selective epitaxy of a semiconductor material.

In selective epitaxy, the exemplary semiconductor structure can be placed in a process chamber. A reactant gas including a precursor gas for a semiconductor material is flowed into the process chamber simultaneously with, or alternately with, an etchant gas that etches a semiconductor material. The net deposition rate on the deposited semiconductor material is the difference between the deposition rate of a semiconductor material due to the reactant gas less the etch rate of the semiconductor material due to the etchant gas. The selective epitaxy process does not deposit any semiconductor material on dielectric surfaces such as the surfaces of the first gate spacer 62A, the surface of the first conformal dielectric material layer 62L, or the surface of the insulator layer 20 because any semiconductor material that nucleates on the dielectric surfaces is etched by the etchant gas before a contiguous layer of a deposited semiconductor material can be formed on the dielectric surfaces.

The reactant gas can be, for example, $SiH_4$, $SiH_2Cl_2$, $SiHCl_3$, $SiCl_4$, $Si_2H_6$, $GeH_4$, $Ge_2H_6$, $CH_4$, $C_2H_2$, or combinations thereof. The etchant gas can be, for example, HCl. A carrier gas such as $H_2$, $N_2$, or Ar can be employed in conjunction with the reactant gas and/or the etchant gas.

The first source region 32S and the first drain region 32D can be formed on physically exposed portions of the top surface of the doped semiconductor layer 12 and the physically exposed surfaces of the first semiconductor fin 30A by selective deposition of an epitaxial semiconductor material. For example, the first source region 32S is formed in the first source-side trench 31S, and the first drain region 32D is formed in the first drain-side trench 31D. The first source region 32S can be formed within the first source-side trench 31S and on the first end wall of the first semiconductor fin 30A, and the first drain region 32D can be formed within the first drain-side trench 31D and on the second end of the first semiconductor fin 30A. The first source region 32S can contact a sidewall of the insulator layer 20 that is vertically coincident with the first end wall of the first semiconductor fin 30A, and the first drain region 32D can be formed on another sidewall of the insulator layer 20 that is vertically coincident with the second end wall of the first semiconductor fin 30A.

In one embodiment, the doped semiconductor layer 12 is single crystalline, and each of the first source region 32S and the first drain region 32D includes a single crystalline semiconductor material portion that is formed with epitaxial alignment to the doped semiconductor layer 12. In one embodiment, the first source region 32S and the first drain region 32D can include single crystalline semiconductor material portions that are epitaxially aligned to the semiconductor material of the first semiconductor fin 30A or the semiconductor material of the doped semiconductor layer 12. As used herein, "epitaxial" alignment refers to alignment of atoms in a same single crystalline structure. For example, each of the first semiconductor fin 30A and the doped semiconductor layer 12 can be single crystalline, and each of the first source region 32S and the first drain region 32D can include a portion that is epitaxially aligned to the doped semiconductor layer 12 and another portion that is epitaxially aligned to the first semiconductor fin 30A.

The semiconductor material of the first source region 32S and the first drain region 32D can be the same as, or different from, the semiconductor material of the first semiconductor fin 30A. Further, the semiconductor material of the first source region 32S and the first drain region 32D can be the same as, or different from, the semiconductor material of the doped semiconductor layer 12.

In one embodiment, the lattice constant of the semiconductor material deposited by selective epitaxy can have a different lattice constant than the lattice constant of the semiconductor material of the doped semiconductor layer 12. In one embodiment, the doped semiconductor layer 12 is single crystalline, and the first source region 32S and the first drain region 32D include a single crystalline semiconductor material having a lattice constant that is different from the lattice constant of the single crystalline semiconductor material in the doped semiconductor layer 12.

In one embodiment, the first semiconductor fin 30A and the doped semiconductor layer 12 can include single crystalline silicon, and the first source region 32S and the first drain region 32D can include a single crystalline silicon-germanium alloy material. In this case, the first source region 32S and the first drain region 32D can apply a compressive stress along the lengthwise direction of the first semiconductor fin 32A, i.e., along the direction connecting the center of mass of the first source region 32S and the center of mass of the second drain region 32D. In one embodiment, the first source region 32S and the first drain region 32D can be p-doped.

In one embodiment, the first semiconductor fin 30A and the doped semiconductor layer 12 can include single crystalline silicon, and the first source region 32S and the first drain region 32D can include a single crystalline silicon-carbon alloy material. In this case, the first source region 32S and the first drain region 32D can apply a tensile stress along the lengthwise direction of the first semiconductor fin 32A. In one embodiment, the first source region 32S and the first drain region 32D can be n-doped.

In one embodiment, the first source region 32S and the first drain region 32D can be formed with in-situ doping so that the first source region 32S and the first drain region 32D are doped with electrical dopants during the selective epitaxy. The first source region 32S and the first drain region 32D can be doped with electrical dopants of the second conductivity type, which is the opposite of the first conductivity type. Thus, the first source region 32S and the first drain region 32D are doped with dopants of the opposite conductivity type as dopants implanted to form the doped semiconductor region 12. For example, the doped semiconductor layer 12 can have a doping of the first conductivity type, the first source region 32S and the second source region 32D can have a doping of the second conductivity type that is the opposite of the first conductivity type.

Alternately, the first source region 32S and the first drain region 32D can be formed without doping so that the first source region 32S and the first drain region 32D are formed as intrinsic semiconductor material portions. In this case, electrical dopants of the second conductivity type can be introduced into the first source region 32S and the first drain region 32D in a subsequent processing step.

In one embodiment, each of the first source region 32S and the first drain region 32D can be formed by a selective epitaxy process that simultaneously grows a semiconductor material from physically exposed surfaces of the semiconductor substrate (10, 12) within the first source-side trench 31S and the first drain-side trench 31D and from physically exposed surfaces of the remaining portion of the first semiconductor fin 31A. A grain boundary between single crystalline semiconductor material portions can be formed within each of the first source region 32S and the first drain region 32D.

In one embodiment, a grain boundary is present within each of the first source region 32S and the first drain region 32D because the first source region 32S and the first drain region 32D include a plurality of single crystalline grains that grow from different single crystalline surfaces. For example, each of the first source region 32S or the first drain region 32D can include a single crystalline grain that grows from a surface of the doped semiconductor layer 12, and a grain that grows from an end surface of the first semiconductor fin 30A. In this case, each of the first source region 32S and the first drain region 32D can include a portion that is epitaxially aligned to the doped semiconductor layer 12 and at least another portion that is epitaxially aligned to the first semiconductor fin 30A. In one embodiment, each grain boundary can contact a vertical sidewall of the insulator layer 20.

Figure 5:
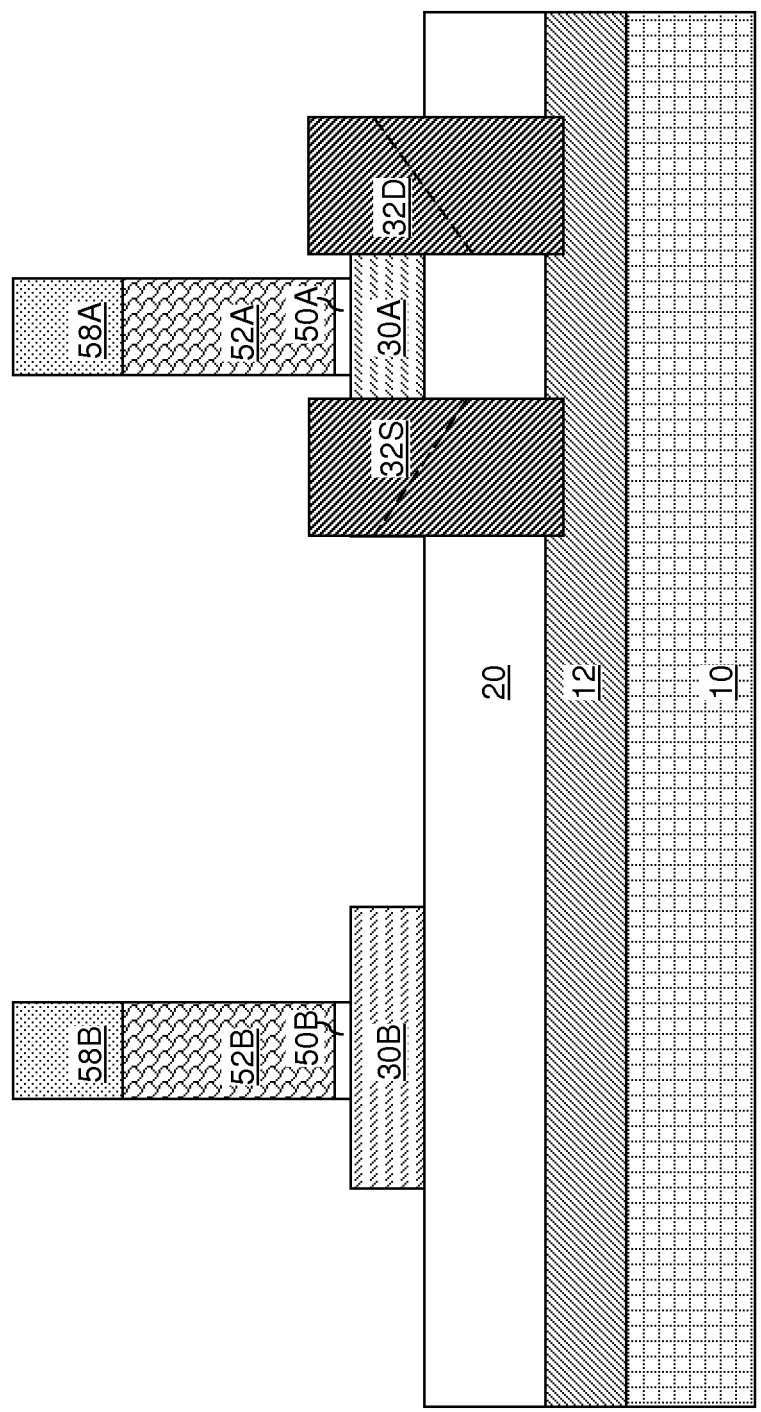
FIG. 5 is a vertical cross-sectional view of the first exemplary semiconductor structure after removal of the first gate spacer and the first conformal dielectric material layer according to the first embodiment of the present disclosure.

Referring to FIG. 5, the first gate spacer 62A and the first conformal dielectric material layer 62L can be removed, for example, by an isotropic etch such as a wet etch.

Figure 6:
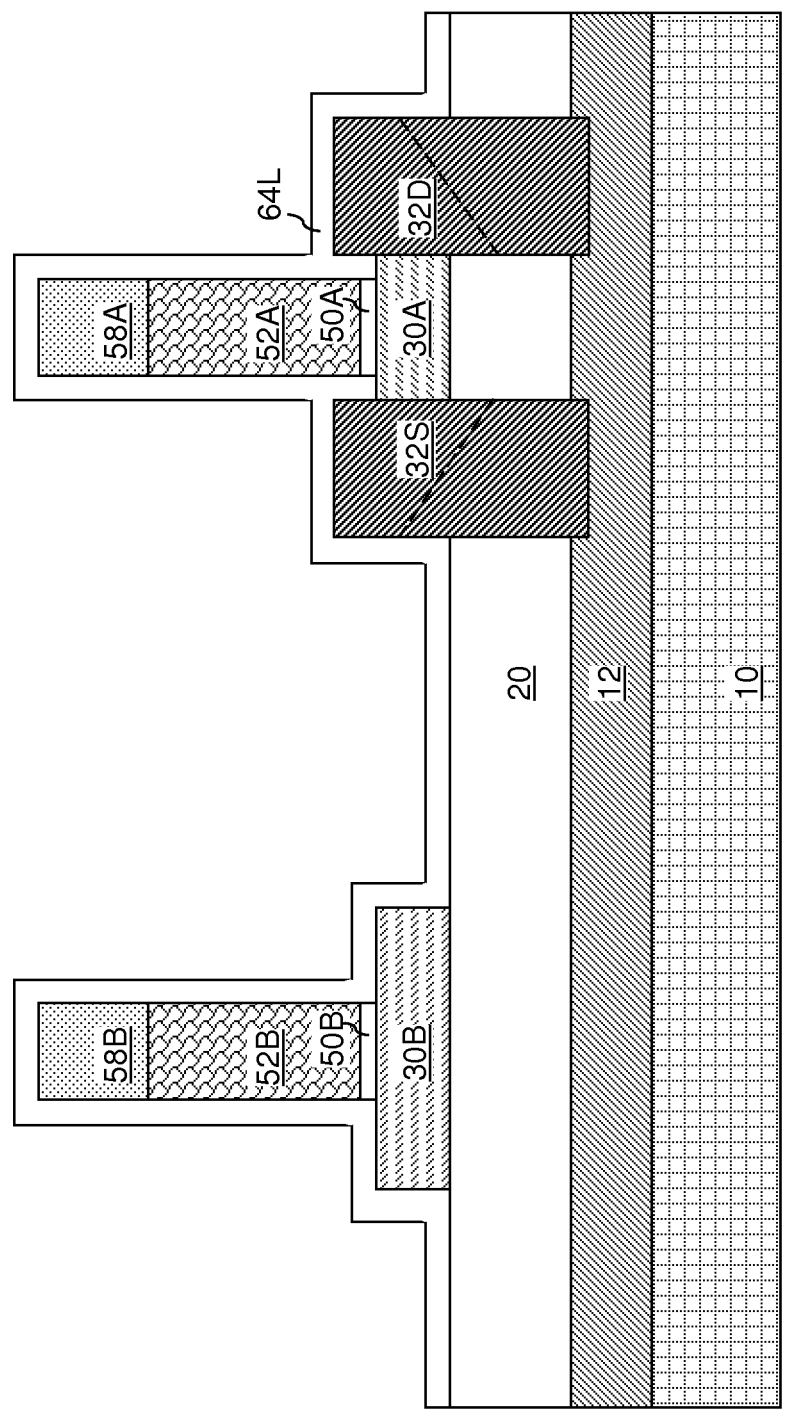
FIG. 6 is vertical cross-sectional view of the first exemplary semiconductor structure after formation of a second conformal dielectric material layer according to the first embodiment of the present disclosure.

Referring to FIG. 6, a second conformal dielectric material layer 64L can be deposited on physically exposed surfaces of the first and second gate stacks (50A, 52A, 58A, 50B, 52B, 58B), the insulator layer 20, the first semiconductor fin 30A, the second semiconductor fin 30B, the first source region 32S, and the first drain region 32D. The second conformal dielectric material layer 64L includes a dielectric material such as silicon nitride, silicon oxide, silicon oxynitride, non-porous organosilicate glass, and/or porous organosilicate glass. The thickness of the second conformal dielectric material layer 64L can be in a range from 10 nm to 100 nm, although lesser and greater thicknesses can also be employed.

Figure 7:
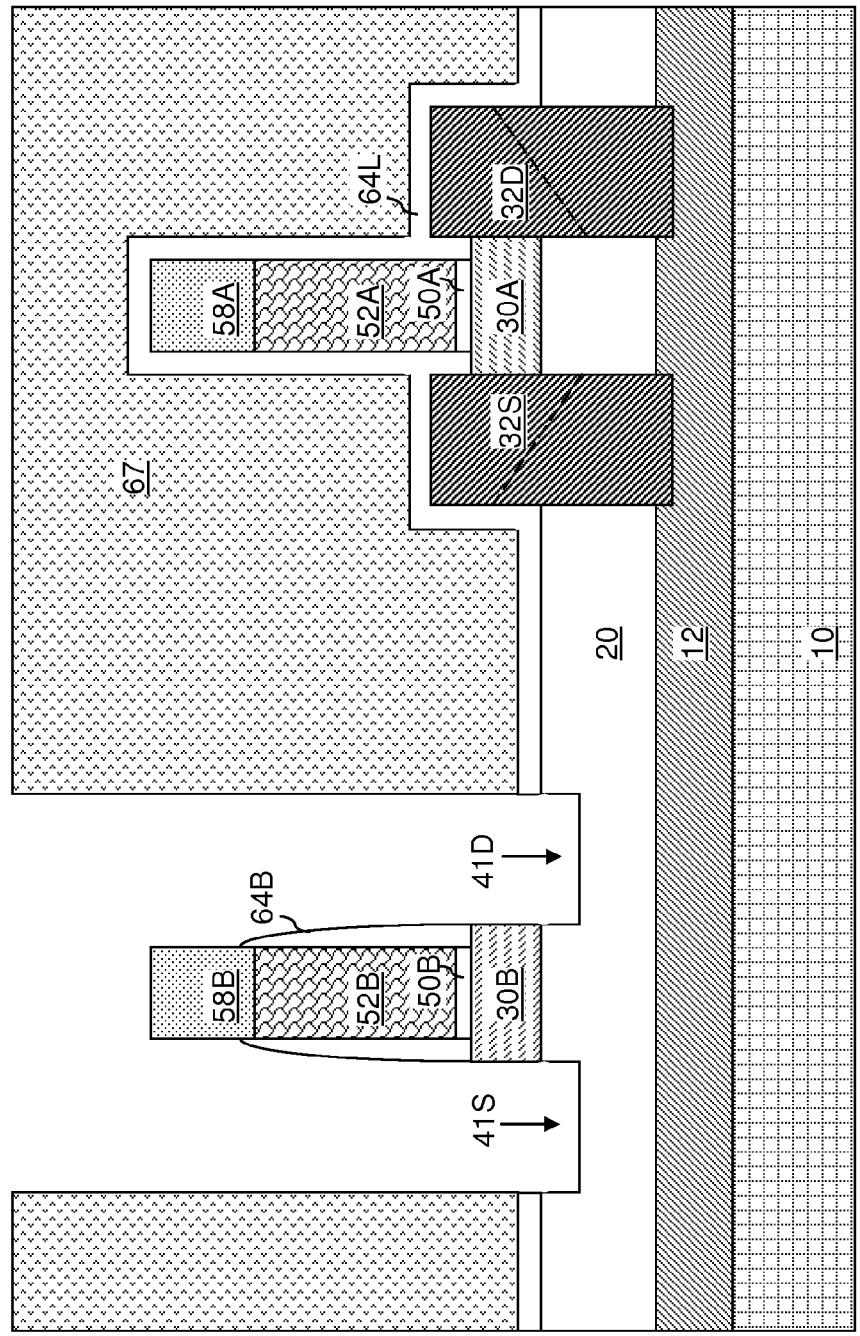
FIG. 7 is a vertical cross-sectional view of the first exemplary semiconductor structure after formation of a second source-side trench and a second drain-side trench and a second gate spacer according to the first embodiment of the present disclosure.

Referring to FIG. 7, a second mask layer 67 is formed and patterned. In one embodiment, the second mask layer 67 can be a patterned photoresist layer. For example, a photoresist layer can be applied over the second conformal dielectric material layer 64L and lithographically patterned to form at least one opening over areas in which a source region and a drain region for a field effect transistor to be formed employing the second semiconductor fin 30B. Peripheries of the at least one opening include edges that coincide with boundaries of a source region and a drain region to be formed.

An anisotropic etch is performed on the portion of the second conformal dielectric material layer 64L within the at least one opening. The portions of the second conformal dielectric material layer on the second semiconductor fin 30B and the second gate stack (50B, 52B, 58B) are etched by the anisotropic etch. Horizontal portions of the second conformal dielectric material layer 64L are removed by the anisotropic etch, and remaining vertical portions of the second conformal dielectric material layer 64L within the at least one opening constitute a second gate spacer 64B. The second gate spacer 64B laterally surrounds the second gate stack (50B, 52B, 58B).

Unmasked portions of the second semiconductor fin 30B and the insulator layer 30 can be etched employing the combination of at least the patterned mask layer and the second gate stack (50B, 52B, 58B) as an etch mask. A trench, which is herein referred to as a second source-side trench 41S, can be formed on one side of the second gate stack (50B, 52B, 58B), and another trench, which is herein referred to as a second drain-side trench 41D, can be formed on another side of the gate stack (50B, 52B, 58B).

Specifically, an anisotropic etch process can be performed to remove physically exposed portions of the second semiconductor fin 30B, i.e., the portions of the second semiconductor fin 30B that are not covered by the second gate stack (50B, 52B, 58B) or the second gate spacer 64B. The anisotropic etch that removes the remove physically exposed portions of the second semiconductor fin 30B may, or may not, be selective to the dielectric material of the insulator layer 20.

Subsequently, physically exposed portions of the insulator layer 20 can be etched by another anisotropic etch process to a depth that is less than the thickness of the insulator layer 20. The anisotropic etch process can etch the dielectric material of the insulator layer 20 employing the combination of the patterned second mask layer 67, the second gate stack (50B, 52B, 58B), and the and the second gate stack (50B, 52B, 58B) as an etch mask.

The second source-side trench 41S and the second drain-side trench 41D can be formed through the insulator layer 20 by the anisotropic etch. The second source-side trench 41S can be formed within an area in which a source region is to be subsequently formed, and the second drain-side trench 41D can be formed within an area in which a drain region is to be subsequently formed. The second source-side trench 41S and the second drain-side trench 41D do not extend to the semiconductor substrate (10, 12). The bottom surfaces of the second source-side trench 41S and the second drain-side trench 41D are recessed surfaces of the insulator layer 20.

End walls of remaining portions of the second semiconductor fin 30B can be vertically coincident with lower portions of sidewalls of the second gate spacer 64B. Further, a sidewall surface of the first source-side trench 41S can be vertically coincident with a first end wall of the second semiconductor fin 30B, and a sidewall surface of the second drain-side trench 41D can be vertically coincident with a second end wall of the second semiconductor fin 30B. The second mask layer 67 is subsequently removed. If the second mask layer 67 is a patterned photoresist layer, the second mask layer 67 can be removed by ashing.

Figure 8:
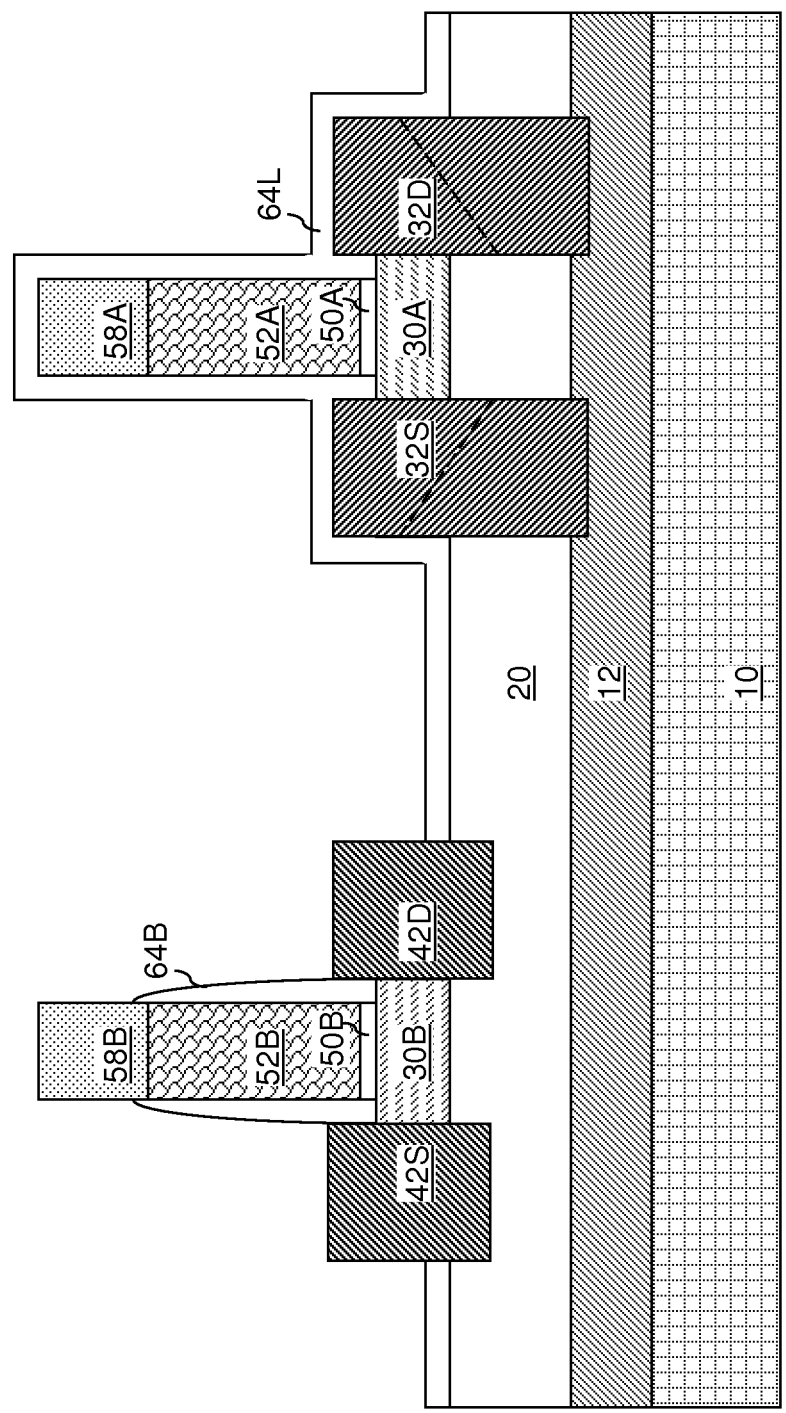
FIG. 8 is a vertical cross-sectional view of the first exemplary semiconductor structure after formation of a second source region and a second drain region by selective deposition of a semiconductor material according to the first embodiment of the present disclosure.

Referring to FIG. 8, a semiconductor material can be deposited on physically exposed end surfaces of the second semiconductor fin 30B. A second source region 42S and a second drain region 42D can be formed, for example, by selective epitaxy of a semiconductor material. The second source region 32S and the second drain region 32D are vertically spaced from the semiconductor substrate (10, 12) by the insulator layer 20.

The second source region 42S and the second drain region 42D can be formed on the physically exposed surfaces of the second semiconductor fin 30B by selective deposition of an epitaxial semiconductor material. The second source region 42S can be formed within the second source-side trench 41S and on the first end wall of the second semiconductor fin 30B, and an second drain region 42D can be formed within the second drain-side trench 41D and on the second end of the second semiconductor fin 30B. The second source region 42S can contact a sidewall of the insulator layer 20 that is vertically coincident with the first end wall of the second semiconductor fin 30B, and the first drain region 6D can be formed on another sidewall of the insulator layer 20 that is vertically coincident with the second end wall of the second semiconductor fin 30B.

In one embodiment, each of the second source region 42S and the second drain region 42D can include a single crystalline semiconductor material portion that is epitaxially aligned to the semiconductor material of the second semiconductor fin 30B. The second semiconductor fin 30B can be single crystalline, and each of the second source region 42S and the second drain region 42D can consist of a single crystalline semiconductor material portion that is epitaxially aligned to the second semiconductor fin 30B. The semiconductor material of the second source region 42S and the second drain region 42D can be the same as, or different from, the semiconductor material of the first semiconductor fin 30A.

In one embodiment, the second source region 42S and the second drain region 42D can be formed with in-situ doping so that the second source region 42S and the second drain region 42D are doped with electrical dopants during the selective epitaxy. The second source region 42S and the second drain region 42D can be doped with electrical dopants of the first conductivity type. Thus, the second source region 42S and the second drain region 42D are doped with dopants of the opposite conductivity type as dopants present in the first source region 32S and the first drain region 32D. In this case, a first field effect transistor including the first source region 32S and the first drain region 32D can be an opposite type of field effect transistor with respect to a second field effect transistor include the second source region 42S and the second drain region 42D. For example, the first field effect transistor can be a p-type field effect transistor and the second field effect transistor can be an n-type field effect transistor.

Alternately, the second source region 42S and the second drain region 42D can be formed without doping so that the second source region 42S and the second drain region 42D are formed as intrinsic semiconductor material portions. In this case, electrical dopants of the second conductivity type can be introduced into the second source region 42S and the second drain region 42D in a subsequent processing step.

The first exemplary semiconductor structure includes the doped semiconductor layer 12 located in the semiconductor substrate (10, 12), the insulator layer 20 located on a top surface of the doped semiconductor layer 12, the first semiconductor fin 30A located on a first portion of a top surface of the insulator layer 20, the first source region 32S contacting a first end wall of the first semiconductor fin 30A and filling a first trench extending from the first end wall of the first semiconductor fin 30A through the insulator layer 20 and into the doped semiconductor layer 12, and the first drain region 32D contacting a second end wall of the first semiconductor fin 30A and filling a second trench extending from the second end wall of the first semiconductor fin 30A through the insulator layer 20 and into the doped semiconductor layer 12. The first exemplary semiconductor structure further includes the second semiconductor fin 30B located on a second portion of the top surface of the insulator layer 20, the second source region 42S contacting a first end wall of the second semiconductor fin 30B and vertically spaced from the semiconductor substrate (10, 12) by the insulator layer 20, and a second drain region 42D contacting a second end wall of the second semiconductor fin 30B and vertically spaced from the semiconductor substrate (10, 12) by the insulator layer 20.

In one embodiment, the doped semiconductor layer 12 is single crystalline, and each of the first source region 32S and the first drain region 32D includes a single crystalline semiconductor material portion that is epitaxially aligned to the doped semiconductor layer 12. In another embodiment, the first source region 32S and the first drain region 32D includes a single crystalline semiconductor material having a lattice constant that is different from the lattice constant of a single crystalline semiconductor material in the doped semiconductor layer 12. In yet another embodiment, the first source region 32S and the second source region 32D applies a compressive stress or a tensile stress to the first semiconductor fin 30A. In a further embodiment, the first semiconductor fin 30A includes silicon, and the single crystalline semiconductor material of the first source region 32S and the first drain region 32D includes a p-doped silicon-germanium alloy material.

In one embodiment, the first semiconductor fin 30A is single crystalline, and each of the first source region 32S and the first drain region 32D includes a single crystalline semiconductor material portion that is epitaxially aligned to the first semiconductor fin 30A. In another embodiment, the doped semiconductor layer 12 is single crystalline, and each of the first source region 32S and the first drain region 32D includes another single crystalline semiconductor material portion that is epitaxially aligned to the single crystalline semiconductor material of the doped semiconductor layer 12. In yet another embodiment, two single crystalline semiconductor material portions contact each other at a grain boundary that extends to a vertical sidewall of the insulator layer 20.

In one embodiment, each of the second source region 42S and the second drain region 42D contacts a portion of a topmost surface of the insulator layer 20. In another embodiment, the second source region 42S and the second drain region 42D contact recessed surfaces of the insulator layer 20.

Figure 9:
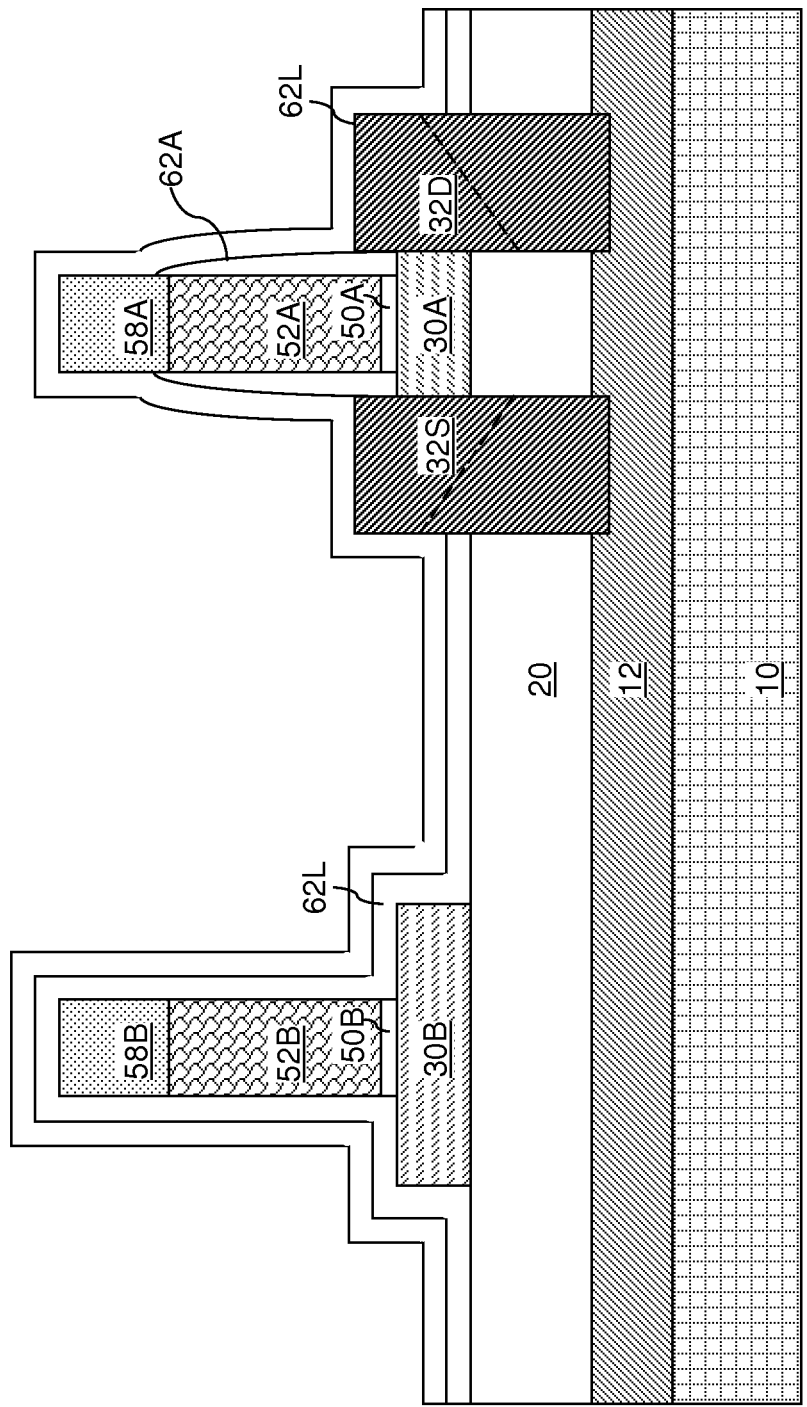
FIG. 9 is a vertical cross-sectional view of a variation of the first exemplary semiconductor structure after formation of a second conformal dielectric material layer according to the first embodiment of the present disclosure.

Referring to FIG. 9, a variation of the first exemplary semiconductor structure can be derived from the first exemplary semiconductor structure of FIG. 4 by depositing a second conformal dielectric material layer 64L without removing the first gate spacer 62A or the first conformal dielectric material layer 62L. The second conformal dielectric material layer 64L can have the same composition, and the same thickness, as the second conformal dielectric material layer 64L illustrated in FIG. 6.

Figure 10:
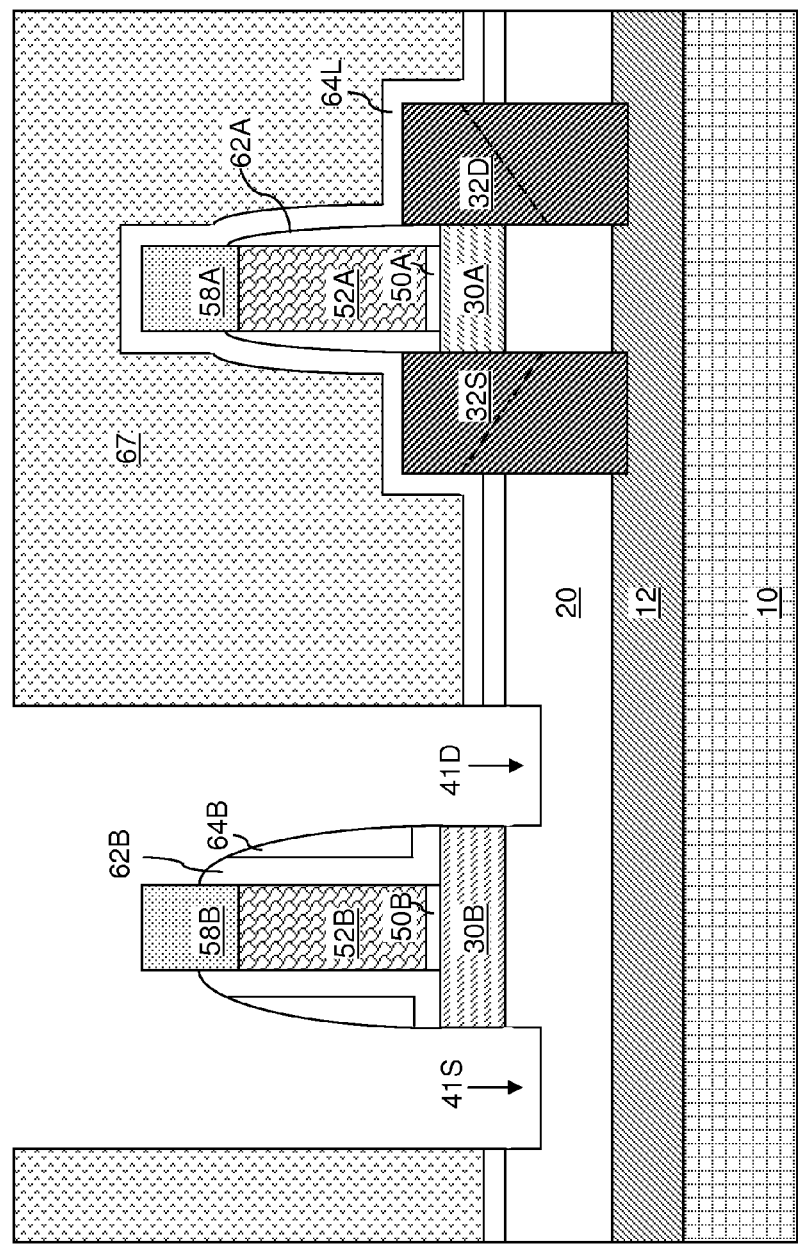
FIG. 10 is a vertical cross-sectional view of the variation of the first exemplary semiconductor structure after formation of a second source-side trench and a second drain-side trench according to the first embodiment of the present disclosure.

Referring to FIG. 10, the processing steps of FIG. 7 can be performed to form the second source-side trench 41S and the second drain-side trench 41D. An inner gate spacer 62B including a remaining portion of the first conformal dielectric material layer 62L can be formed around the second gate stack (50B, 52B, 58B). The inner gate spacer 62B can be an L-shaped gate spacer. A second gate spacer 64B can be formed around the inner gate spacer 62B.

Figure 11:
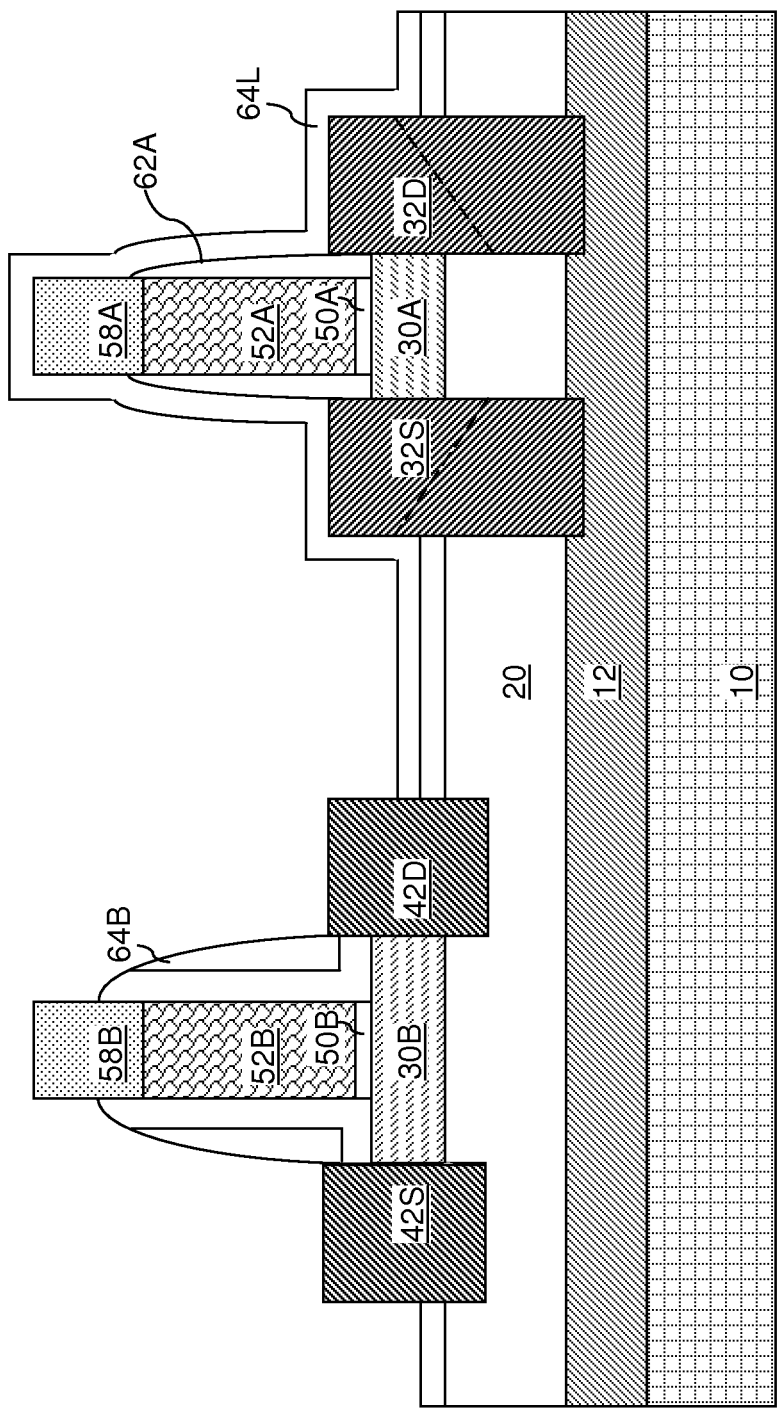
FIG. 11 is a vertical cross-sectional view of the variation of the first exemplary semiconductor structure after formation of a second source region and a second drain region by selective deposition of a semiconductor material according to the first embodiment of the present disclosure.

Referring to FIG. 11, the processing steps of FIG. 8 can be performed to form the second source region 42S and the second drain region 42D.

Figure 12:
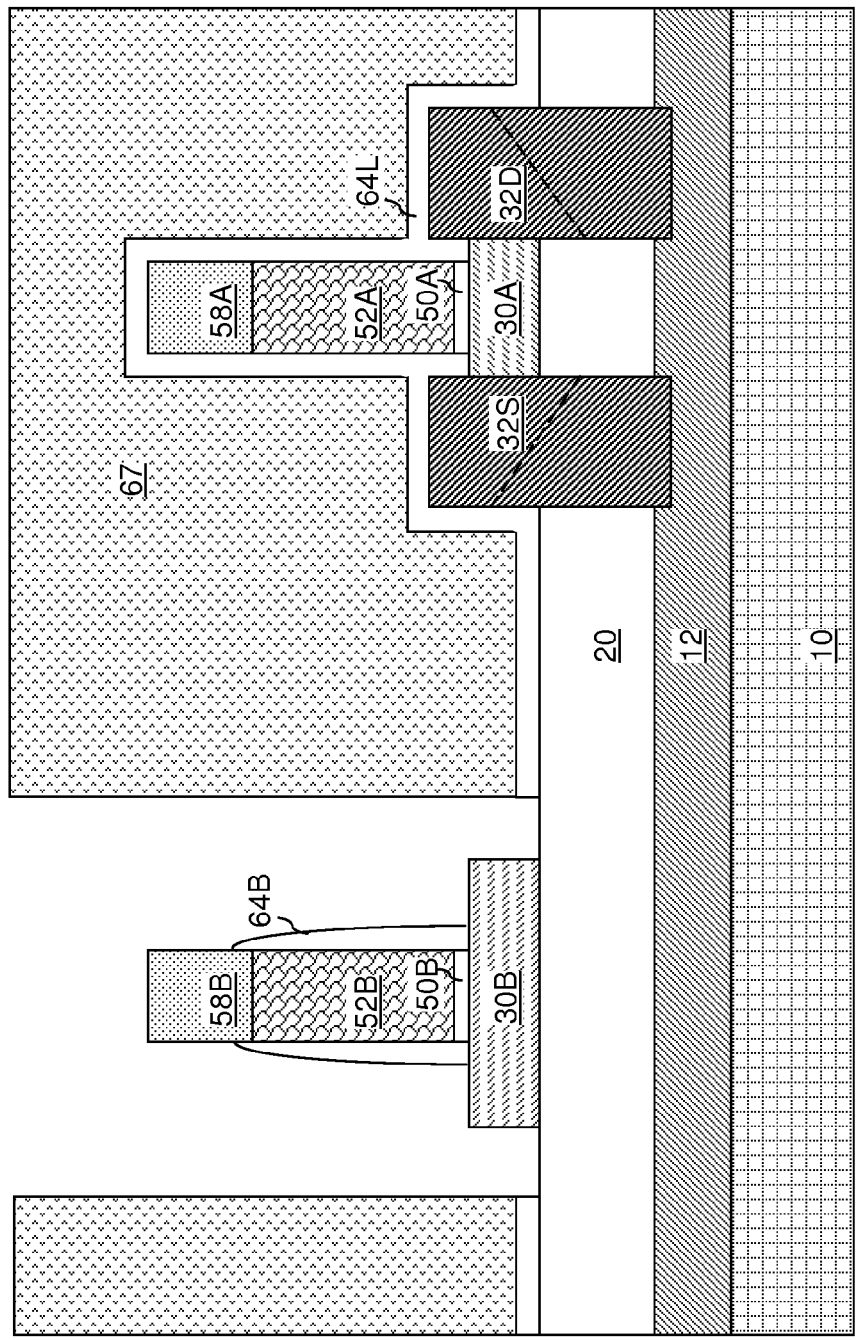
FIG. 12 is a vertical cross-sectional view of a second exemplary semiconductor structure after formation of a second gate spacer according to a second embodiment of the present disclosure.

Referring to FIG. 12, a second exemplary semiconductor structure can be derived from the first exemplary semiconductor structure of FIG. 6 by applying and patterning a second mask layer 67. In one embodiment, the second mask layer 67 can be a photoresist layer. For example, a photoresist layer can be applied over the second conformal dielectric material layer 64L and lithographically patterned to form at least one opening over areas in which a source region and a drain region for a field effect transistor to be formed employing the second semiconductor fin 30B. Peripheries of the at least one opening include edges that coincide with boundaries of a source region and a drain region to be formed.

An anisotropic etch is performed on the portion of the second conformal dielectric material layer 64L within the at least one opening. The portions of the second conformal dielectric material layer on the second semiconductor fin 30B and the second gate stack (50B, 52B, 58B) are etched by the anisotropic etch. Horizontal portions of the second conformal dielectric material layer 64L are removed by the anisotropic etch, and remaining vertical portions of the second conformal dielectric material layer 64L within the at least one opening constitute a second gate spacer 64B. The second gate spacer 64B laterally surrounds the second gate stack (50B, 52B, 58B).

The anisotropic etch can be selective to the semiconductor material of the second semiconductor fin 30B. In this case, the semiconductor material of the second semiconductor fin 30B is not etched by the anisotropic etch. The topmost surface of the insulator layer 20 can be physically exposed around end portions of the second semiconductor fin 30B by the anisotropic etch. The end walls of the second semiconductor fin 30B are laterally offset from the vertical planes including the outer sidewalls of lower portions of the second gate spacer 64B. The second mask layer 67 is subsequently removed. If the second mask layer 67 is a patterned photoresist layer, the second mask layer 67 can be removed by ashing.

Figure 13:
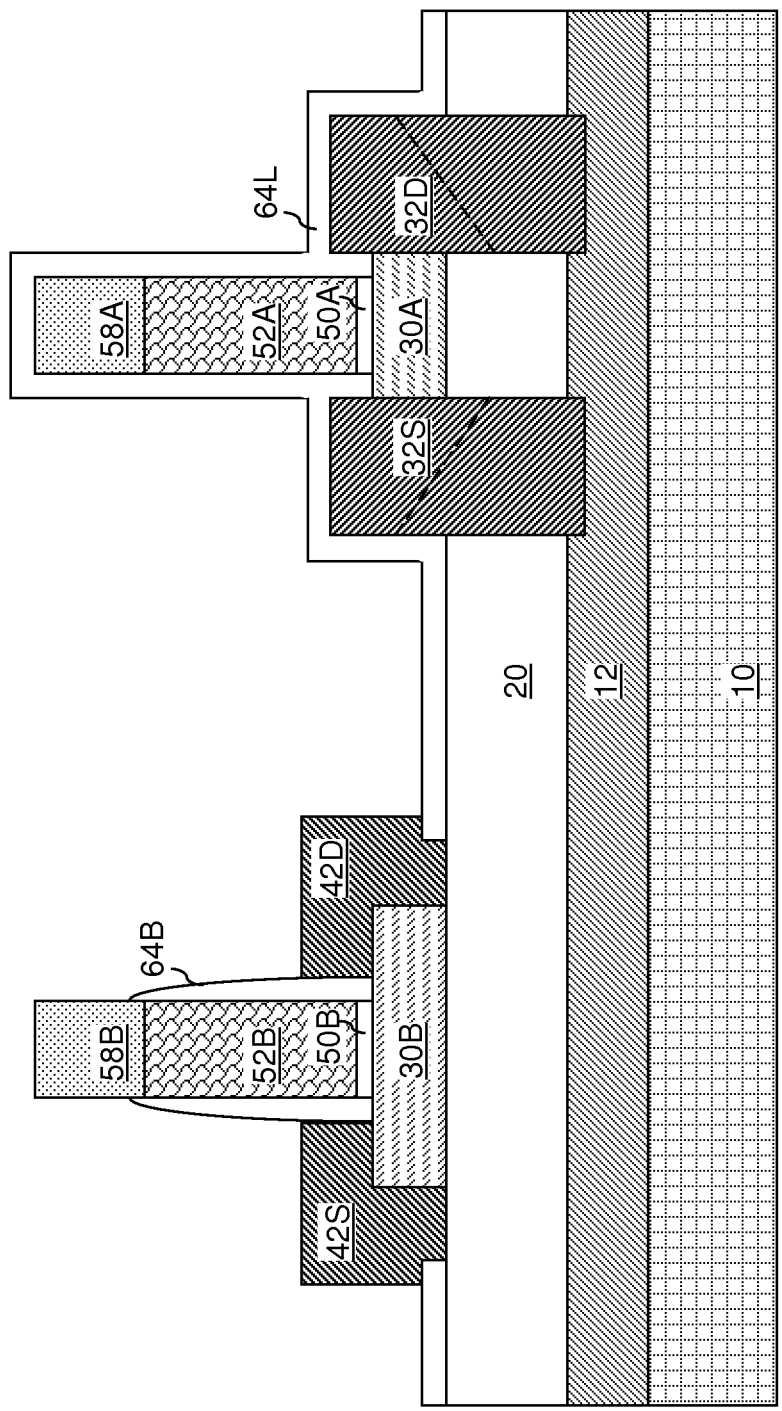
FIG. 13 is a vertical cross-sectional view of the second exemplary semiconductor structure after formation of a second source region and a second drain region by selective deposition of a semiconductor material according to the second embodiment of the present disclosure.

Referring to FIG. 13, the processing steps of FIG. 8 are performed to form a second source region 42S and a second drain region 42D. Each of the second source region 42S and the second drain region 42S can be single crystalline, and can be epitaxially aligned to the single crystalline semiconductor material of the second semiconductor fin 30B.

Figure 14:
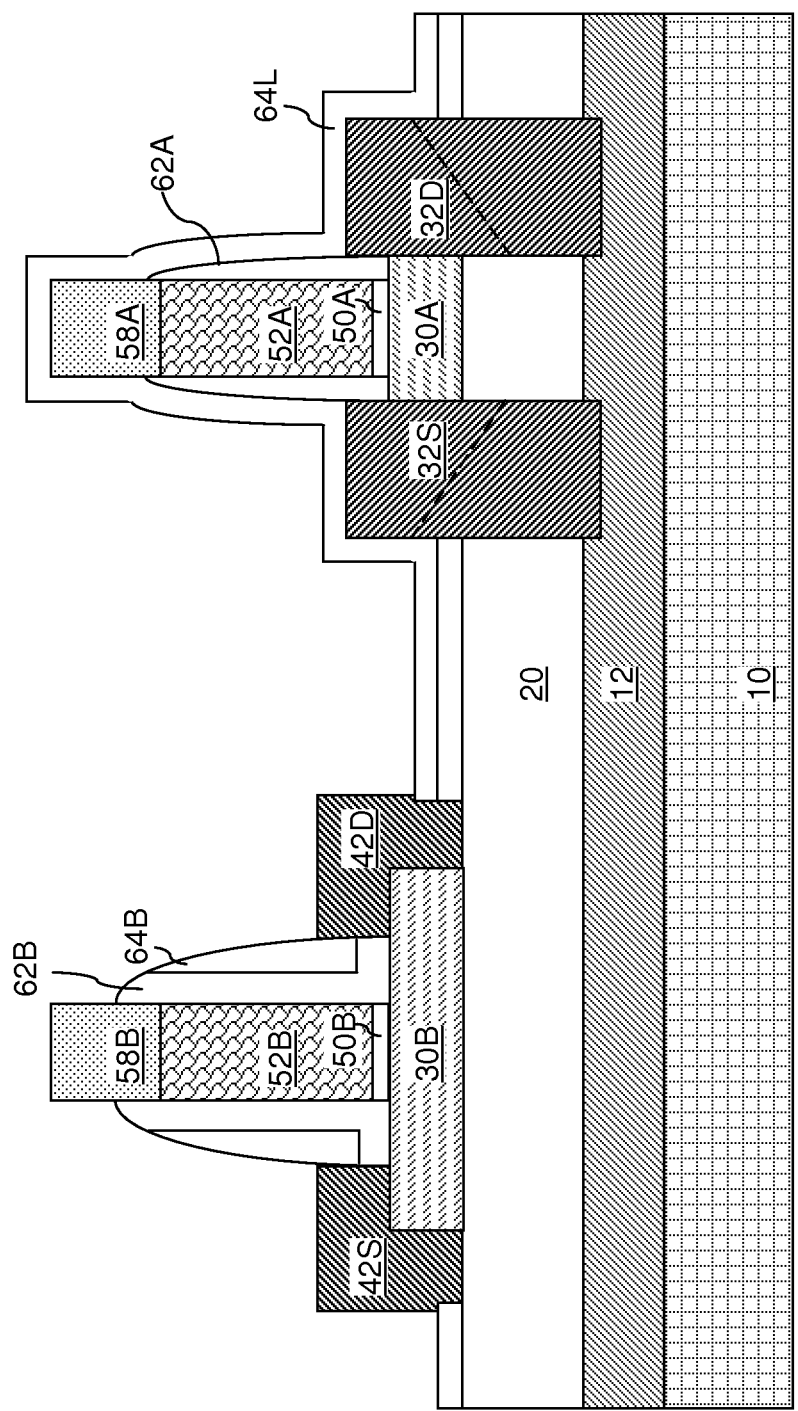
FIG. 14 is a vertical cross-sectional view of a variation of the second exemplary semiconductor structure according to the second embodiment of the present disclosure.

Referring to FIG. 14, a variation of the second exemplary semiconductor structure can be derived from the second exemplary semiconductor structure can be derived from the variation of the first exemplary semiconductor structure illustrated in FIG. 9 by performing the processing steps of FIG. 12. Specifically, a mask layer such as a photoresist layer can be applied and patterned such that at least one opening is formed over areas in which a source region and a drain region for a field effect transistor to be formed employing the second semiconductor fin 30B. Peripheries of the at least one opening include edges that coincide with boundaries of a source region and a drain region to be formed.

An anisotropic etch is performed on the portions of the first and second conformal dielectric material layers (62L, 64L) within the at least one opening. The portions of the second conformal dielectric material layer 64L and the first conformal dielectric material layer 62L located on the second semiconductor fin 30B and the second gate stack (50B, 52B, 58B) are etched by the anisotropic etch. Horizontal portions of the first and second conformal dielectric material layers (62L, 64L) are removed by the anisotropic etch. Remaining vertical portions of the first conformal dielectric material layer 62L within the at least one opening constitute an inner gate spacer 62B. Remaining vertical portions of the second conformal dielectric material layer 64L within the at least one opening constitute a second gate spacer 64B. The inner gate spacer 62B laterally surrounds the second gate stack (50B, 52B, 58B). The second gate spacer 64B laterally surrounds the inner gate spacer 62B. The inner gate spacer 62B can be an L-shaped gate spacer.

Figure 15:
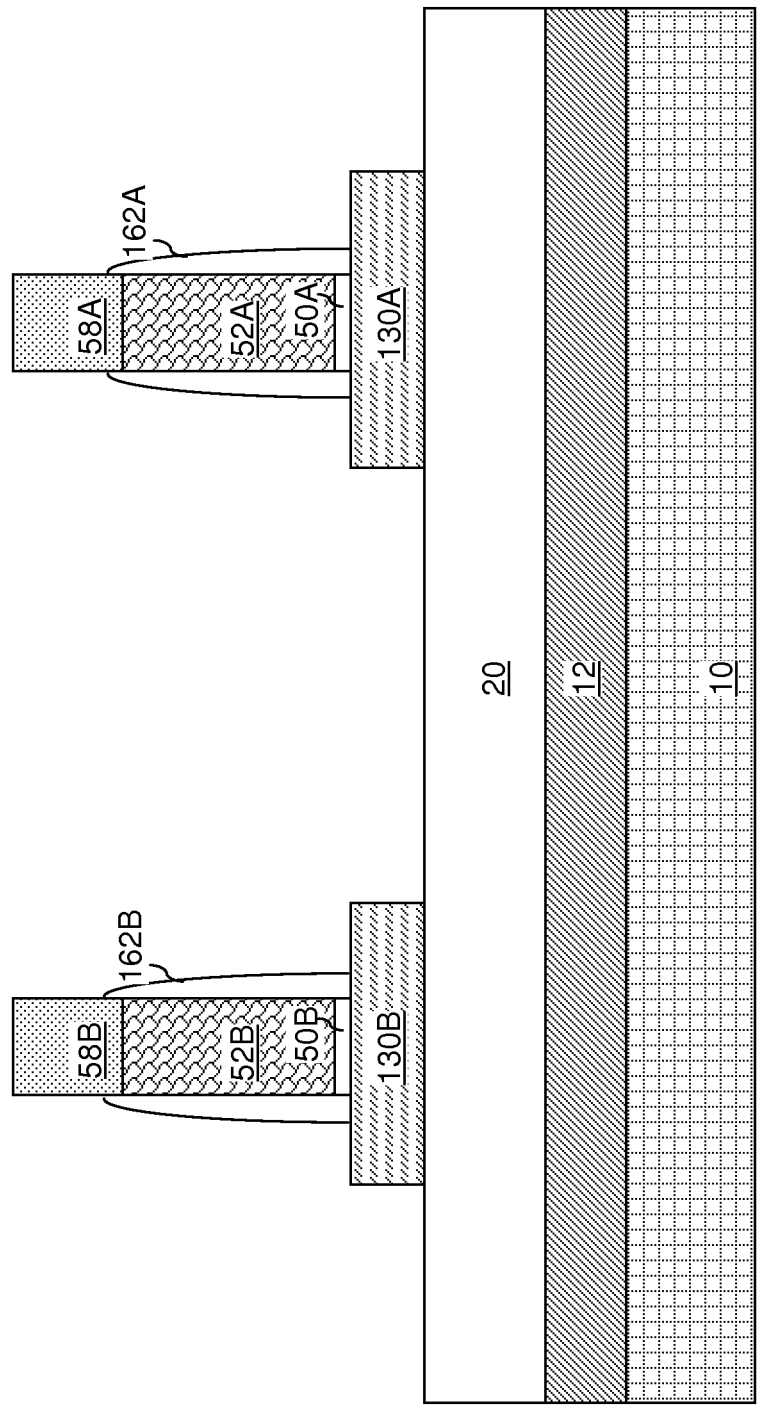
FIG. 15 is a vertical cross-sectional view of a third exemplary semiconductor structure after formation of gate electrodes and gate spacers according to a third embodiment of the present disclosure.

Referring to FIG. 15, a third exemplary semiconductor structure can be derived from the first exemplary semiconductor structure of FIG. 1 by substituting the first semiconductor fin 30A and the second semiconductor fin 30B with a first semiconductor fin 130A and a second semiconductor fin 130B. The first semiconductor fin 130A can be identical to the first semiconductor fin 30A of the first and second embodiments as provided at the processing step of FIG. 1. The second semiconductor fin 130B can be intrinsic, or can have a doping of the first conductivity type, which is the same conductivity type as the doping of the doped semiconductor layer 12. Thus, the first semiconductor fin 130A and the second semiconductor fin 130B can have a same type of doping in the third embodiment.

The processing steps of FIGS. 2A and 2B can be subsequently performed. Subsequently, an anisotropic etch is performed to form a first gate spacer 162A and a second gate spacer 162B, which laterally surround a first gate stack (50A, 52A, 58A) and a second gate stack (50B, 52B, 58B), respectively. The first and second gate spacers (162A, 162B) are remaining portions of the first conformal dielectric material layer 62L.

Figure 16:
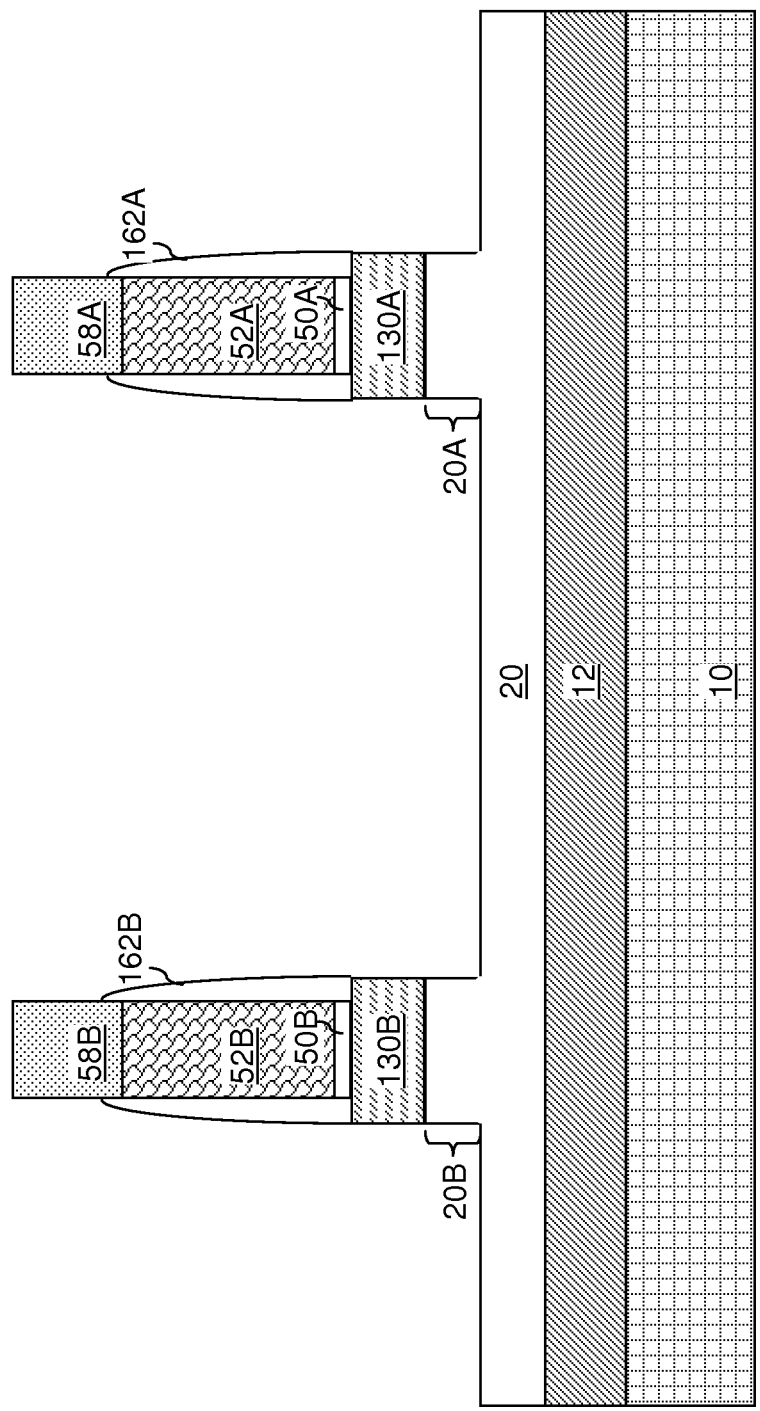
FIG. 16 is a vertical cross-sectional view of the third exemplary semiconductor structure after anisotropically etching physically exposed portions of semiconductor fins and after recessing a top surface of the insulator layer according to the third embodiment of the present disclosure.

Referring to FIG. 16, physically exposed portions of the first and second semiconductor fins (130A, 130B) can be anisotropically etched. Concurrently or subsequently, the top surface of the insulator layer 20 can be recessed by the same anisotropic etch or by a different anisotropic etch. A first insulator pedestal portion 20A is formed underneath the remaining portion of the first semiconductor fin 130A, and a second insulator pedestal portion 20B is formed underneath the remaining portion of the second semiconductor fin 130B.

Figure 17:
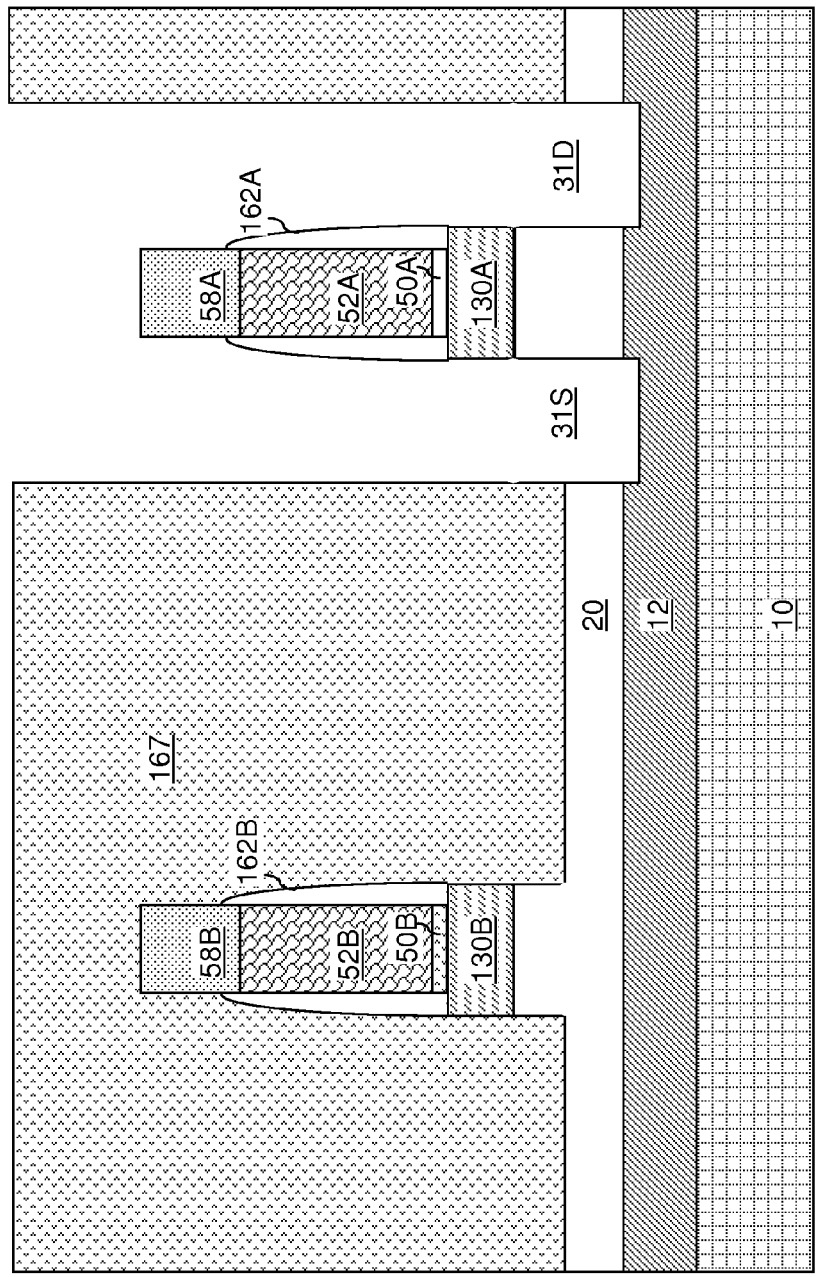
FIG. 17 is a vertical cross-sectional view of the third exemplary semiconductor structure after formation of a source-side trench and a drain-side trench according to the third embodiment of the present disclosure.

Referring to FIG. 17, a first mask layer 65 is formed and patterned. In one embodiment, the first mask layer 65 can be a patterned photoresist layer. For example, a photoresist layer can be applied over the first conformal dielectric material layer 62L and lithographically patterned to form at least one opening over areas in which a source region and a drain region for a field effect transistor to be formed employing the first semiconductor fin 30A. Peripheries of the at least one opening include edges that coincide with boundaries of a source region and a drain region to be formed.

An anisotropic etch is performed on the portion of the insulator layer 20 within the at least one opening. Unmasked portions of the insulator layer 30 can be etched employing the combination of at least the patterned mask layer and the first gate stack (50A, 52A, 58A) as an etch mask. A first trench can be formed on one side of the first gate stack (50A, 52A, 58A), and a second trench can be formed on another side of the gate stack (50A, 52A, 58A).

Specifically, physically exposed portions of the insulator layer 20 can be etched by the anisotropic etch process. The anisotropic etch process can etch the dielectric material of the insulator layer 20 employing the combination of the patterned first mask layer 65, the first gate stack (50A, 52A, 58A), and the and the first gate stack (50A, 52A, 58A) as an etch mask.

The first trench and the second trench can be formed through the insulator layer 20 by the anisotropic etch. The first trench can be formed within an area in which a source region is to be subsequently formed, and the second trench can be formed within an area in which a drain region is to be subsequently formed. The first trench is herein referred to as a first source-side trench 31S, and the second trench is herein referred to as a first drain-side trench 31D. The first source-side trench 31S and the first drain-side trench 31D can extend into an upper portion of the semiconductor substrate (10, 12). For example, the first source-side trench 31S and the first drain-side trench 31D can extend into the doped semiconductor layer 12 such that the bottom surfaces of the first source-side trench 31S and the first drain-side trench 31D are between the top surface of the doped semiconductor layer 12 and the bottom surface of the doped semiconductor layer 12. In this case, the first source-side trench 31S and the first drain-side trench 31D are formed into the doped semiconductor material layer 12.

End walls of remaining portions of the first semiconductor fin 30A can be vertically coincident with lower portions of sidewalls of the first gate spacer 62A. Further, a sidewall surface of the first source-side trench 31S can be vertically coincident with a first end wall of the first semiconductor fin 30A, and a sidewall surface of the first drain-side trench 31D can be vertically coincident with a second end wall of the first semiconductor fin 30A. The first mask layer 65 is subsequently removed. If the first mask layer 65 is a patterned photoresist layer, the first mask layer 65 can be removed by ashing.

Figure 18:
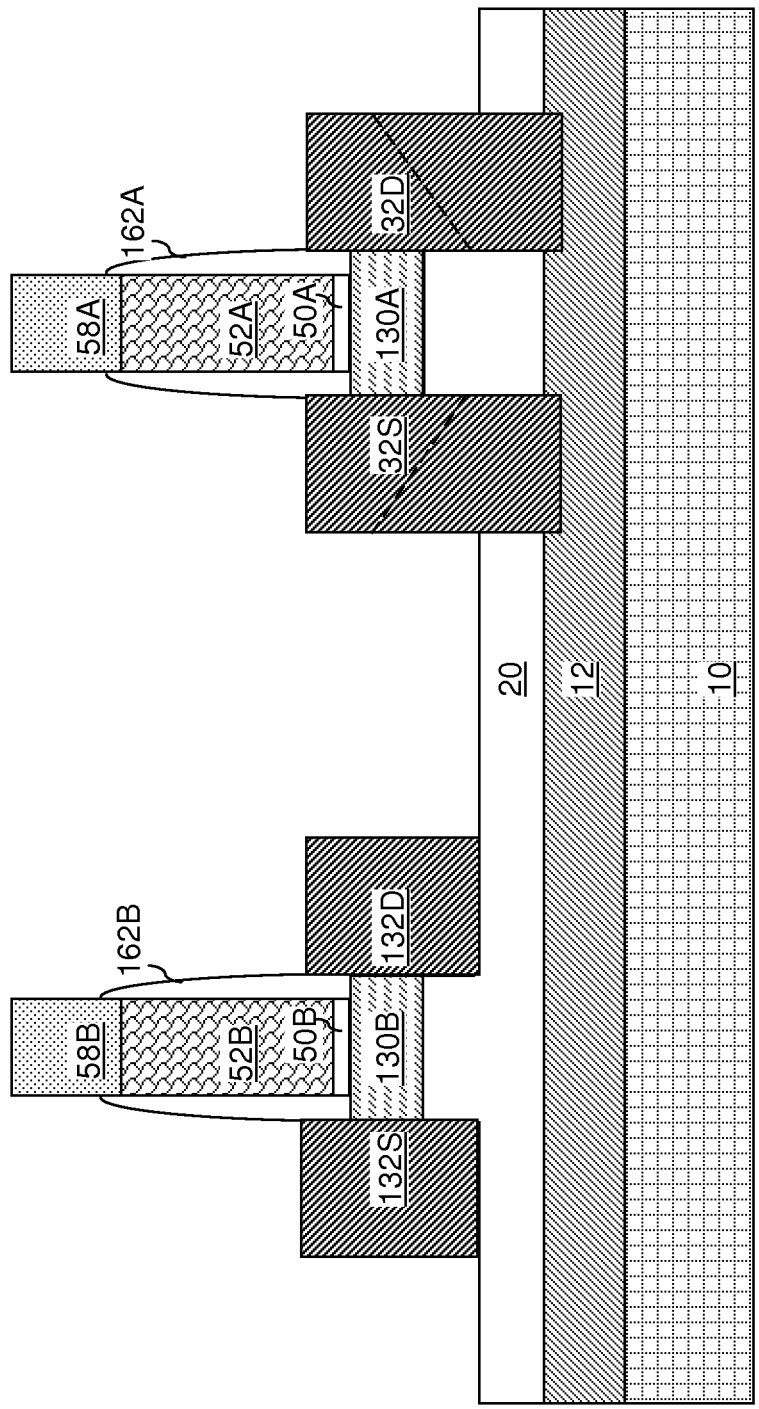
FIG. 18 is a vertical cross-sectional view of the third exemplary semiconductor structure after formation of a first source region, a first drain region, a second source region, and a second drain region according to the third embodiment of the present disclosure.

Referring to FIG. 18, the processing steps of FIGS. 4-8 can be performed to form a first source region 32S, a first drain region 32D, a second source region 42S, and a second drain region 42D. The semiconductor materials of the first source region 32S and the first drain region 32D can be epitaxially aligned to the semiconductor materials of the doped semiconductor layer 12 and the first semiconductor fin 130A, and may apply a compressive or tensile stress to the first semiconductor fin 130A, in the same manner as in the first and second embodiments. The semiconductor materials of the second source region 42S and second drain region 42D can be epitaxially aligned to the semiconductor materials of the second semiconductor fin 130B.

Figure 19:
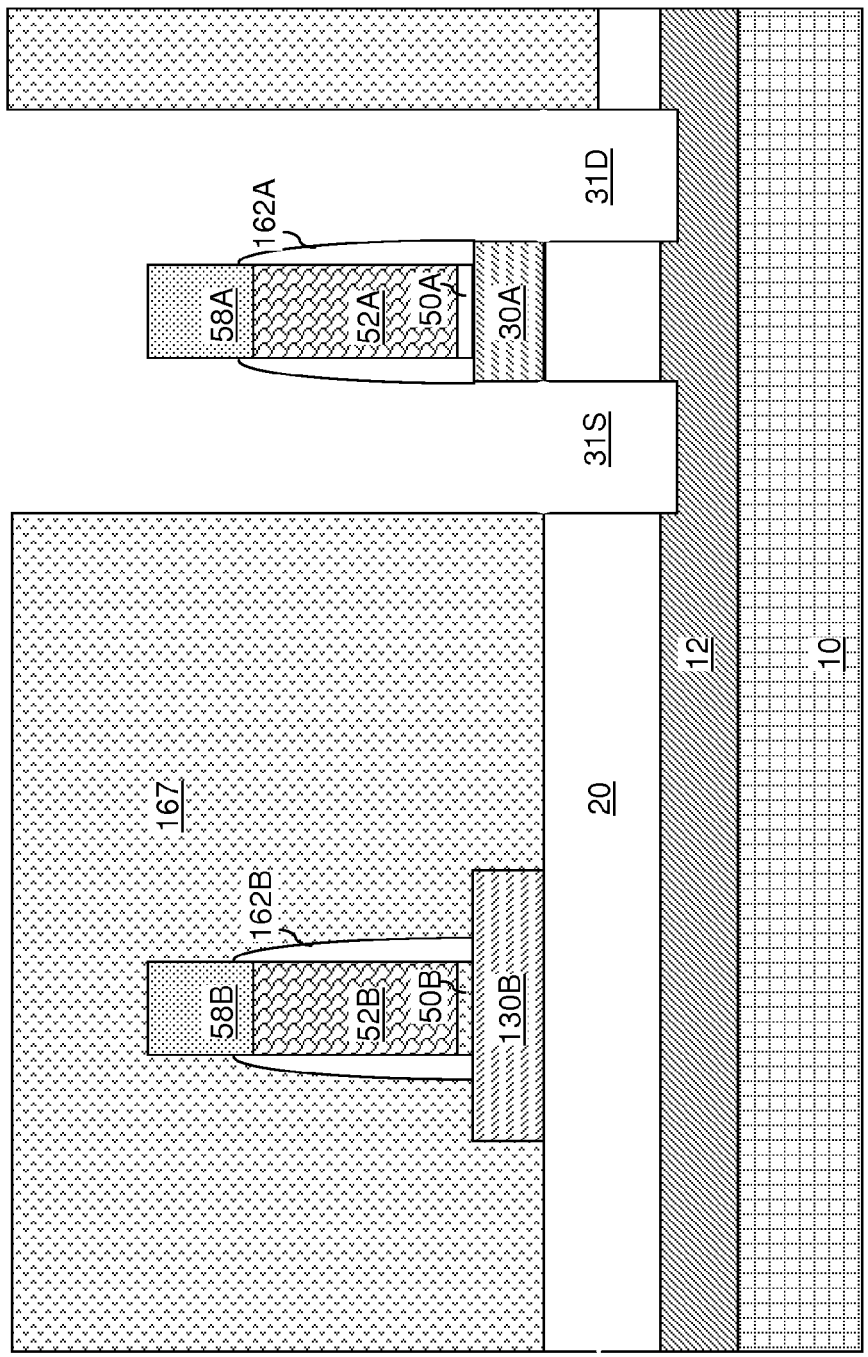
FIG. 19 is a vertical cross-sectional view of a variation of the third exemplary semiconductor structure after formation of a source-side trench and a drain-side trench according to the third embodiment of the present disclosure.

Referring to FIG. 19, a variation of the third exemplary semiconductor structure can be derived from the third exemplary semiconductor structure of FIG. 15 by forming, and patterning, a first mask layer 65. In one embodiment, the first mask layer 65 can be a patterned photoresist layer. For example, a photoresist layer can be applied over the first conformal dielectric material layer 62L and lithographically patterned to form at least one opening over areas in which a source region and a drain region for a field effect transistor to be formed employing the first semiconductor fin 30A. Peripheries of the at least one opening include edges that coincide with boundaries of a source region and a drain region to be formed.

The physically exposed portions of the first semiconductor fin 130A and the physically exposed portions of the insulator layer 20 can be etched by an anisotropic etch within the at least one opening. Unmasked portions of the insulator layer 30 can be etched employing the combination of at least the patterned mask layer and the first gate stack (50A, 52A, 58A) as an etch mask. A first source-side trench 31S can be formed on one side of the first gate stack (50A, 52A, 58A), and a first drain-side trench 31D can be formed on another side of the gate stack (50A, 52A, 58A) in the same manner as in the first and second embodiments. The first mask layer 65 is subsequently removed.

Figure 20:
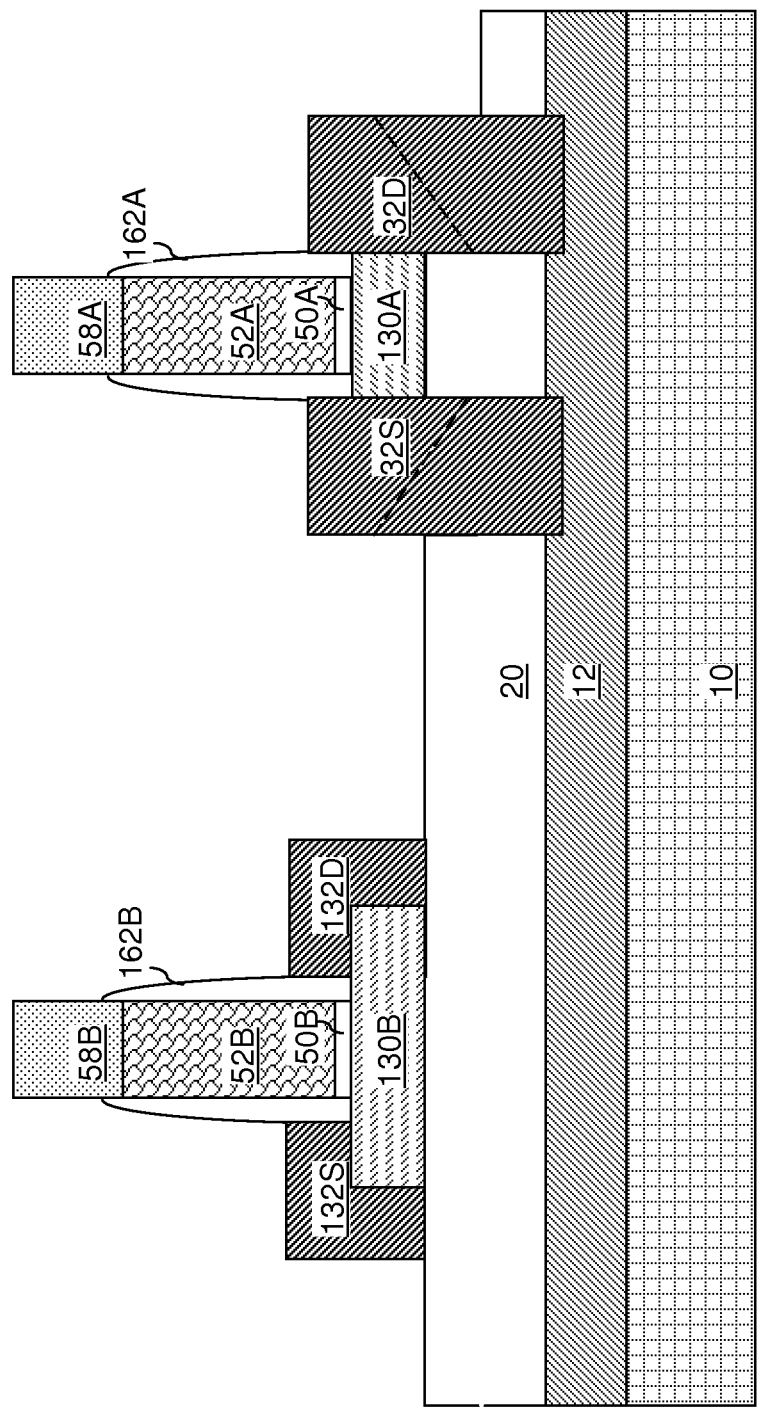
FIG. 20 is a vertical cross-sectional view of a variation of the third exemplary semiconductor structure after formation of a first source region, a first drain region, a second source region, and a second drain region according to the third embodiment of the present disclosure.

Referring to FIG. 20, the processing steps of FIGS. 4-8 can be performed in the same manner as in the first embodiment. Alternately, the processing steps of the second embodiment may be performed instead. Yet alternately, the processing steps of the variations of the first and second embodiment may be performed.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a doped semiconductor layer located in a semiconductor substrate;
   an insulator layer located on a top surface of said doped semiconductor layer;
   a first semiconductor fin located on a first portion of a top surface of said insulator layer;
   a first gate stack straddling said first semiconductor fin;
   a first source region contacting a first end wall of said first semiconductor fin and said doped semiconductor layer and extending through said insulator layer;
   a first drain region contacting a second end wall of said first semiconductor fin and said doped semiconductor layer, spaced from said first source region, and extending through said insulator layer;
   a second semiconductor fin located on a second portion of said top surface of said insulator layer;
   a second gate stack straddling said second semiconductor fin;
   a second source region contacting a first end wall of said second semiconductor fin and vertically spaced from said semiconductor substrate by said insulator layer; and
   a second drain region contacting a second end wall of said second semiconductor fin and vertically spaced from said semiconductor substrate by said insulator layer.

2. The semiconductor structure of claim 1, wherein said doped semiconductor layer is single crystalline, and each of said first source region and said first drain region includes a single crystalline semiconductor material portion that is epitaxially aligned to said doped semiconductor layer.

3. The semiconductor structure of claim 1, wherein said doped semiconductor layer is single crystalline, and said first source region and said first drain region includes a single crystalline semiconductor material having a lattice constant that is different from a lattice constant of a single crystalline semiconductor material in said doped semiconductor layer.

4. The semiconductor structure of claim 3, wherein said first source region and said second source region applies a compressive stress or a tensile stress to said first semiconductor fin.

5. The semiconductor structure of claim 3, wherein said first semiconductor fin comprises silicon, and said single crystalline semiconductor material of said first source region and said first drain region comprises a p-doped silicon-germanium alloy material.

6. The semiconductor structure of claim 1, wherein said first semiconductor fin is single crystalline, and each of said first source region and said first drain region includes a single crystalline semiconductor material portion that is epitaxially aligned to said first semiconductor fin.

7. The semiconductor structure of claim 6, wherein said doped semiconductor layer is single crystalline, and each of said first source region and said first drain region includes another single crystalline semiconductor material portion that is epitaxially aligned to a single crystalline semiconductor material of said doped semiconductor layer.

8. The semiconductor structure of claim 7, wherein said single crystalline semiconductor material portion and said another single crystalline semiconductor material portion contact each other at a grain boundary that extends to a vertical sidewall of said insulator layer.

9. The semiconductor structure of claim 1, wherein each of said second source region and said second drain region contacts a portion of a topmost surface of said insulator layer.

10. The semiconductor structure of claim 1, wherein said second source region and said second drain region contact recessed surfaces of said insulator layer.

11. A method of forming a semiconductor structure comprising:
    forming a first semiconductor fin and a second semiconductor fin on a top surface of a stack, from bottom to top, of a semiconductor substrate and an insulator layer, wherein said forming said first semiconductor fin and said second semiconductor fin comprises lithographically patterning a topmost semiconductor material layer of a semiconductor-on-insulator substrate;
    forming a first gate stack and a second gate stack straddling said first semiconductor fin and said second semiconductor fin, respectively;
    forming a first trench and a second trench through said insulator layer and into an upper portion of said semiconductor substrate by etching unmasked portions of said first semiconductor fin and said insulator layer employing a combination of at least a patterned mask layer and said first gate stack as an etch mask, wherein said first trench is formed on one side of said first gate stack and said second trench is formed on another side of said gate stack;
    forming a first source region in said first trench, on a first end wall of a remaining portion of said first semiconductor fin, and on a first portion of said semiconductor substrate, and a first drain region in said second trench, on a second end wall of said remaining portion of said semiconductor fin, and on a second portion of said semiconductor substrate; and forming a second source region and a second drain region on a remaining portion of said second semiconductor fin, wherein said second source region and said second drain region are vertically spaced from said semiconductor substrate by said insulator layer.

12. The method of claim 11, further comprising forming a doped semiconductor layer within said semiconductor substrate, wherein said first trench and said second trench are formed into said doped semiconductor material layer.

13. The method of claim 12, wherein said doped semiconductor layer is single crystalline, and each of said first source region and said first drain region includes a single crystalline semiconductor material portion that is formed with epitaxial alignment to said doped semiconductor layer.

14. The method of claim 12, wherein said doped semiconductor layer is single crystalline, and said first source region and said first drain region include a single crystalline semiconductor material having a lattice constant that is different from a lattice constant of a single crystalline semiconductor material in said doped semiconductor layer.

15. The method of claim 12, wherein said doped semiconductor layer has a doping of a first conductivity type, said first source region and said second source region have a doping of a second conductivity type, and said second conductivity type is the opposite of said first conductivity type.

16. The method of claim 11, wherein each of said first source region and said first drain region is formed by a selective epitaxy process that simultaneously grows a semiconductor material from physically exposed surfaces of said semiconductor substrate within said first trench and said second trench and from physically exposed surfaces of said remaining portion of said first semiconductor fin.

17. The method of claim 16, wherein a grain boundary between single crystalline semiconductor material portions is formed within each of said first source region and said first drain region.

18. The method of claim 11, further comprising forming a gate spacer around said first gate stack, wherein said combination further includes said gate spacer.

19. The method of claim 18, wherein a sidewall of said first trench is vertically coincident with a first outer sidewall of said gate spacer and with a first end wall of a remaining portion of said first semiconductor fin, and a sidewall of said second trench is vertically coincident with a second outer sidewall of said gate spacer and with a second end wall of said remaining portion of said first semiconductor fin.

20. The method of claim 18, wherein said gate spacer is formed by:
    depositing a conformal dielectric material layer on said first gate stack, said second gate stack, said first semiconductor fin, and said second semiconductor fin; and
    anisotropically etching a portion of said conformal dielectric material layer located on said first semiconductor fin and said first gate stack.

* * * * *